(12) United States Patent
Hayashi et al.

(10) Patent No.: US 10,768,353 B2
(45) Date of Patent: Sep. 8, 2020

(54) METHOD OF MANUFACTURING LIGHT EMITTING MODULE AND LIGHT EMITTING MODULE

(71) Applicant: NICHIA CORPORATION, Anan-shi, Tokushima (JP)

(72) Inventors: Tadao Hayashi, Tokushima (JP); Ryohei Yamashita, Tokushima (JP); Yusaku Achi, Tokushima (JP); Mamoru Imada, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 16/024,018

(22) Filed: Jun. 29, 2018

(65) Prior Publication Data

US 2019/0049649 A1 Feb. 14, 2019

(30) Foreign Application Priority Data

Jun. 30, 2017 (JP) ................................. 2017-128711
Nov. 13, 2017 (JP) ................................. 2017-217877

(51) Int. Cl.
*G02B 6/00* (2006.01)
*F21V 8/00* (2006.01)
(Continued)

(52) U.S. Cl.
CPC ......... *G02B 6/0016* (2013.01); *G02B 6/0026* (2013.01); *G02B 6/0031* (2013.01); *G02B 6/0051* (2013.01); *G02F 1/133603* (2013.01); *G02F 1/133606* (2013.01); *H01L 25/0753* (2013.01); *H01L 33/501* (2013.01); *G02F 2001/133607* (2013.01); *H01L 33/50* (2013.01); *H01L 33/58* (2013.01); *H01L 2933/0058* (2013.01)

(58) Field of Classification Search
CPC .. G02B 6/0026; G02B 6/0016; G02B 6/0021; G02B 6/0045
USPC ....................................................... 362/606
See application file for complete search history.

(56) References Cited

U.S. PATENT DOCUMENTS 6,473,554 B1 * 10/2002 Pelka ................... G02B 6/0018
385/146
2004/0130019 A1 * 7/2004 Chen .................... G02B 6/0021
257/723
(Continued)

FOREIGN PATENT DOCUMENTS

| JP | H10062786 A | 3/1998 |
| JP | 2001210122 A | 8/2001 |

(Continued)

*Primary Examiner* — Christopher M Raabe
(74) *Attorney, Agent, or Firm* — Hunton Andrews Kurth LLP

(57) ABSTRACT

A method of manufacturing a light emitting module according to the present disclosure includes: preparing a light guide plate that comprises a first main surface serving as a light-emitting surface and a second main surface opposite to the first main surface; respectively providing light emitting elements on the second main surface so as to correspond to each of a plurality of optically functional portions provided on the first main surface of the light guide plate; and forming wires electrically connecting the plurality of light emitting elements.

12 Claims, 23 Drawing Sheets

(51) Int. Cl.
*H01L 33/50* (2010.01)
*H01L 25/075* (2006.01)
*G02F 1/13357* (2006.01)
*H01L 33/58* (2010.01)

(56) References Cited

U.S. PATENT DOCUMENTS

| | | | |
|---|---|---|---|
| 2005/0237765 A1* | 10/2005 | Suehiro | H01L 33/54 362/611 |
| 2006/0017863 A1* | 1/2006 | Kim | G02B 6/0021 349/62 |
| 2006/0238873 A1* | 10/2006 | Park | G02B 3/0037 359/600 |
| 2007/0121340 A1 | 5/2007 | Hoshi | |
| 2008/0101084 A1* | 5/2008 | Hsu | G02B 6/0023 362/612 |
| 2008/0123350 A1* | 5/2008 | Choe | G02B 6/0016 362/331 |
| 2010/0079980 A1 | 4/2010 | Sakai | |
| 2011/0194034 A1* | 8/2011 | Shimizu | G02B 6/0016 348/739 |
| 2012/0162966 A1* | 6/2012 | Kim | G02F 1/133606 362/97.1 |
| 2012/0170303 A1 | 7/2012 | Meir | |
| 2014/0133180 A1 | 5/2014 | Sakai | |
| 2015/0036317 A1 | 2/2015 | Yamamoto et al. | |
| 2015/0287892 A1 | 10/2015 | Han et al. | |
| 2017/0102127 A1 | 4/2017 | Woodgate et al. | |

FOREIGN PATENT DOCUMENTS

| | | |
|---|---|---|
| JP | 2001345007 A | 12/2001 |
| JP | 2003242804 A | 8/2003 |
| JP | 2005038776 A | 2/2005 |
| JP | 2007149451 A | 6/2007 |
| JP | 2007214076 A | 8/2007 |
| JP | 2007329114 A | 12/2007 |
| JP | 2008026402 A | 2/2008 |
| JP | 2008059786 A | 3/2008 |
| JP | 2010108919 A | 5/2010 |
| JP | 20 10164976 A | 7/2010 |
| JP | 2011258581 A | 12/2011 |
| JP | 2015032373 A | 2/2015 |
| KR | 2009-0117419 A | 11/2009 |
| KR | 100961290 B1 | 6/2010 |
| KR | 20120133153 A | 12/2012 |
| WO | 2005119314 A2 | 12/2005 |
| WO | 2012141094 A1 | 10/2012 |

* cited by examiner

METHOD OF MANUFACTURING LIGHT EMITTING MODULE AND LIGHT EMITTING MODULE

CROSS-REFERENCE TO RELATED APPLICATIONS

This application claims priority to Japanese Patent Application No. 2017-128711, filed on Jun. 30, 2017 and Japanese Patent Application No. 2017-217877, filed on Nov. 13, 2017, the disclosures of which are hereby incorporated by reference in their entireties.

BACKGROUND

The present disclosure relates to a method of manufacturing a light emitting module, and a light emitting module.

Light-emitting devices using light emitting elements, such as a light emitting diode, are widely used as various light sources, including backlights of liquid crystal displays, other displays, and the like.

For example, a light source device disclosed in JP 2015-32373 A includes: a plurality of light emitting elements mounted on a mounting substrate; hemispherical lens members that respectively seal the plurality of light emitting elements; and a diffusion member disposed thereover and on which light from the light emitting element is incident.

However, in the light source device disclosed in JP 2015-32373 A, the distance between the mounting substrate and a diffusion plate needs to be larger than the thickness of the lens member, which can fail to achieve sufficient thinning of the light source device.

SUMMARY

Therefore, it is an object of the present disclosure to provide a light emitting module which includes a light guide plate and light emitting elements and can be reliably thinned.

A method of manufacturing a light emitting module according to the present disclosure includes:

preparing a light guide plate that comprises a first main surface serving as a light-emitting surface and a second main surface opposite to the first main surface;

respectively providing light emitting elements on the second main surface so as to correspond to each of a plurality of optically functional portions provided on the first main surface of the light guide plate; and forming wires electrically connecting the plurality of light emitting elements.

Accordingly, the light emitting module, including the light guide plate and the light emitting elements, is provided which can be reliably thinned.

DETAILED DESCRIPTION

Figure 1:
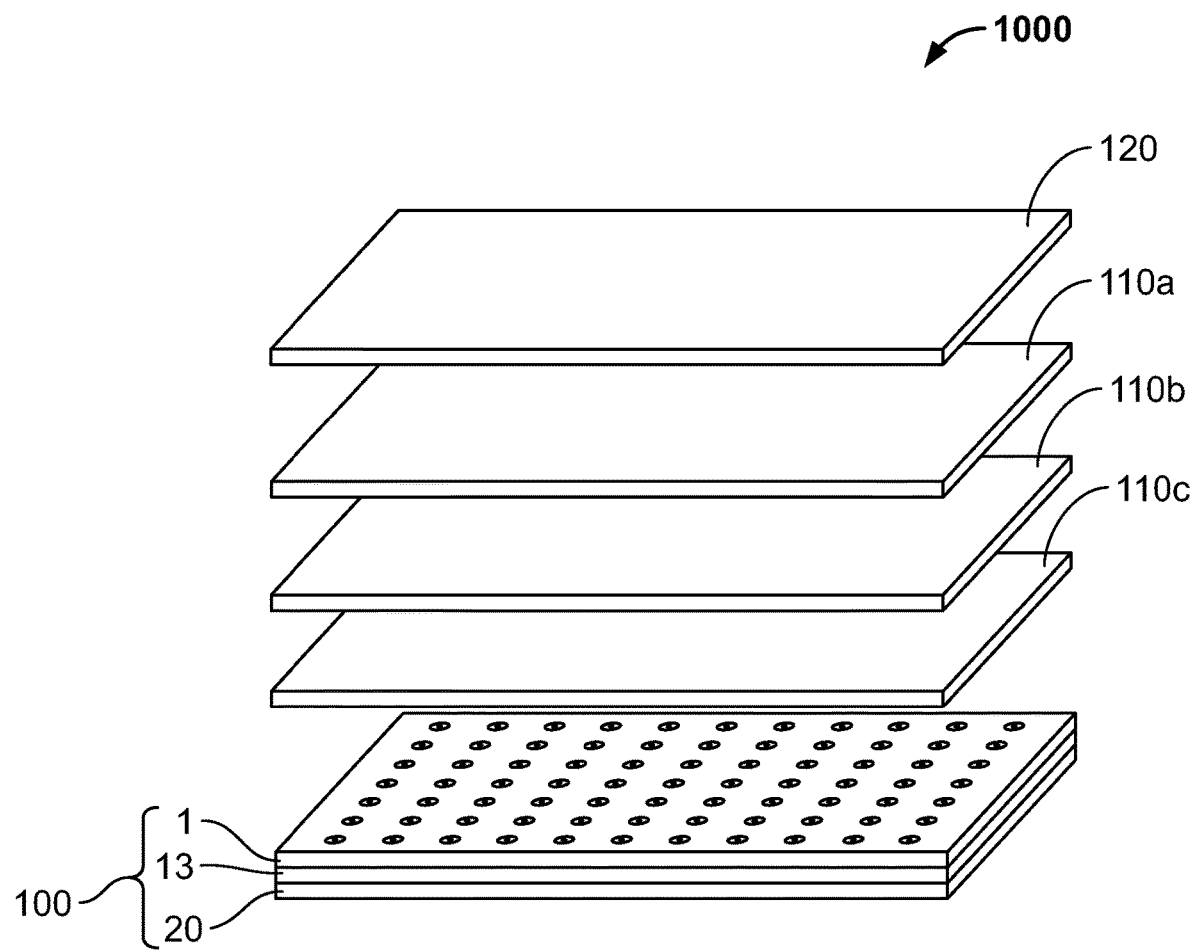
FIG. 1 is a configuration diagram showing components of a liquid crystal display device according to an embodiment of the present disclosure.

The present invention will be described in detail below with reference to the accompanying drawings. Although in the description below, terms indicative of specific directions and positions (e.g., "upper", "lower", and other terms including these words) will be used as needed, these terms are used to make the present invention easier to understand with reference to the drawings and not intended to limit the technical scope of the present invention with their meanings. The same reference characters represented through the drawings denote the same or equivalent parts or members.

The following embodiments are illustrative only of a light emitting module to exemplify the technical idea of the present invention. Thus, the present invention is not limited to the embodiments below. The size, material, shape, relative arrangement, etc., of each component mentioned below are not meant to limit the scope of the present invention only thereto, unless otherwise specified, and are intended to exemplify the present invention. The contents of the description regarding one embodiment or example can also be applied to other embodiments and examples. Furthermore, the size, positional relationship, and the like of members shown in some drawings are emphasized to clarify the description.

(Liquid Crystal Display Device 1000)

FIG. 1 is a configuration diagram showing each component of a liquid crystal display device 1000 according to the present embodiment. The liquid crystal display device 1000 shown in FIG. 1 includes a liquid crystal panel 120, two lens sheets 110*a* and 110*b*, a diffusion sheet 110*c*, and a light emitting module 100 arranged in this order from the upper side thereof. The liquid crystal display device 1000 according to the present embodiment is a so-called direct-lit liquid crystal display device in which the light emitting module 100 is arranged under the liquid crystal panel 120. The liquid crystal display device 1000 irradiates the liquid crystal panel 120 with light emitted from the light emitting module 100. In addition to the above-mentioned components, other members, such as polarizing films, color filters, and a dual brightness enhancement film (DBEF), may be provided.

1. First Embodiment (Light Emitting Module 100)

Figure 2A:
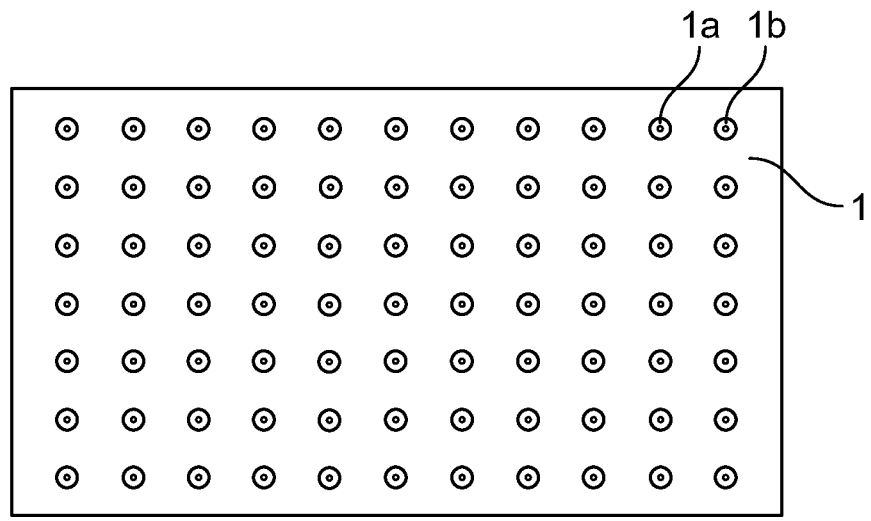
FIG. 2A is a schematic planar view of a light emitting module according to an embodiment of the present disclosure.
Figure 2B:
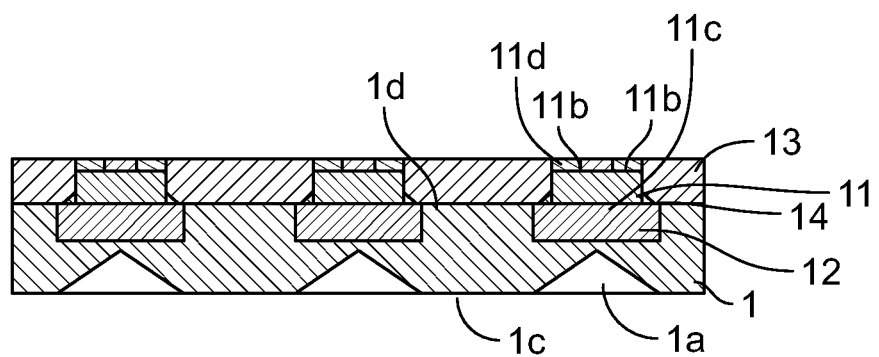
FIG. 2B is a partially enlarged schematic cross-sectional view of a light emitting module according to the embodiment of the present disclosure.
Figure 2C:
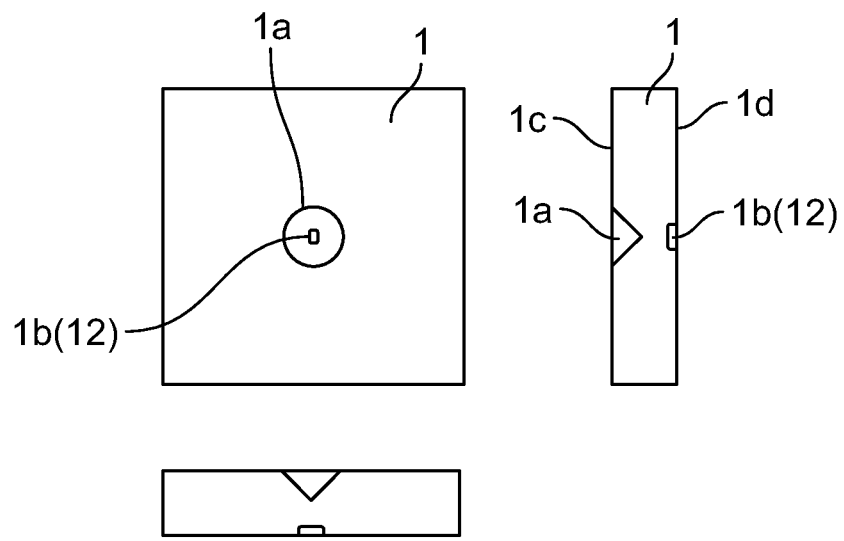
FIG. 2C shows a partially enlarged schematic planar view and a partially enlarged schematic side view of an example of an optically functional portion and a concave portion in a light guide plate according to an embodiment of the present disclosure.

The configuration of the light emitting module in the present embodiment is shown in FIGS. 2A to 2C.

FIG. 2A is a schematic planar view 100 of the light emitting module according to the present embodiment. FIG. 2B is a partially enlarged schematic cross-sectional view showing the light emitting module 100 according to the present embodiment. FIG. 2C shows a partially enlarged schematic planar view and a partially enlarged schematic cross-sectional view of an example of optically functional portions and concave portions in a light guide plate according to the embodiment.

The light emitting module 100 includes a light guide plate 1 and a plurality of light emitting elements 11 joined to the light guide plate 1. The plurality of light emitting elements 11 is arranged on the light guide plate 1 in a matrix. The light guide plate 1 in the light emitting module 100 has a first main surface 1*c* serving as a light-emitting surface, and a second main surface 1*d* opposite to the first main surface 1*c*. The second main surface 1*d* of the light guide plate 1 is provided with a plurality of concave portions 1*b*. In the respective concave portions 1*b*, a wavelength conversion material is disposed to form a plurality of wavelength conversion portions 12, which are spaced apart from each other. Each light emitting element 11 is joined to each of the wavelength conversion portions.

The light emitting module according to the present disclosure joins the light emitting elements onto the light guide plate and thus can be reliably thinned. As the light emitting elements are mounted and bonded onto the light guide plate, misalignment between the light emitting elements and the light guide plate is less likely to occur, compared to a case where a light guide plate is combined with a substrate on which light emitting elements are mounted. Consequently, the light emitting module with satisfactory optical properties can be obtained. The optical properties of the light emitting module become preferable especially when optically functional portions 1*a* are provided in the light guide plate so as to correspond to the respective light emitting elements, as will be mentioned later.

In the direct-lit liquid crystal display device, since the distance between the liquid crystal panel and the light emitting module is short, unevenness in luminance of the light emitting module could affect unevenness in luminance of the liquid crystal display device. For this reason, a light emitting module with little unevenness in luminance has been desired as the light emitting module dedicated for the direct-lit liquid crystal display device.

With the configuration of the light emitting module 100 in the present embodiment, the thickness of the light emitting module 100 can be reduced to 5 mm or less, 3 mm or less, 1 mm or less, or the like.

The respective components included in the light emitting module 100 and a manufacturing method therefor according to the present embodiment will be described in detail below.

(Light Guide Plate 1)

The light guide plate 1 is a light-transmissive member on which light from the light emitting elements is incident and that emits planar light.

The light guide plate 1 in the present embodiment has the first main surface 1c serving as the light-emitting surface, and the second main surface 1d opposite to the first main surface 1c.

A plurality of light emitting elements 11 is joined to the second main surface 1d of the light guide plate 1. Thus, the distance between the light guide plate 1 and each light emitting element 11 can be shortened, thereby reliably enabling thinning of the light emitting module 100.

The size of the light guide plate 1 can be, for example, about 1 cm to about 200 cm on one side, and is preferably about 3 cm to about 30 cm on one side. The thickness of the light guide plate 1 can be about 0.1 mm to about 5 mm, and is preferably 0.5 mm to 3 mm.

The planar shape of the light guide plate 1 can be, for example, a substantially rectangular shape, a substantially circular shape, or the like.

Examples of material usable for the light guide plate 1 include resin materials, such as thermoplastic resins and thermosetting resins, and optically transparent materials such as glass. Examples of the thermoplastic resins include acrylic resins, polycarbonates, cyclic polyolefins, polyethylene terephthalates, polyesters, and the like, whereas examples of the thermosetting resins include epoxy resins, silicone resins, and the like. In particular, a thermoplastic resin material is preferable because it can be efficiently manufactured by injection molding. Among them, polycarbonates are preferable because of high transparency and low cost. In the method of manufacturing a light emitting device in the present embodiment, after the light emitting elements 11 are mounted on the light guide plate 1, a wiring board is affixed to the light guide plate 1. This manufacturing method can omit a process of applying high temperature, such as solder reflow, and thus can utilize even thermoplastic materials with low heat resistance, such as polycarbonates.

The light guide plate 1 can be formed by, for example, injection molding, transfer molding, thermal transfer, or the like. When the light guide plate 1 includes the optically functional portions 1a and the concave portions 1b, which will be described later, these optically functional portions and concave portions are preferably formed collectively by a mold. As a result, the molding misalignment between the optically functional portion 1a and the concave portion 1b can be reduced.

The light guide plate 1 of the present embodiment may be formed of a single layer, or alternatively may be formed by laminating a plurality of light-transmissive layers. When the plurality of light-transmissive layers is laminated, a layer having a different refractive index, for example, an air layer or the like, is preferably provided between the arbitrary adjacent light-transmissive layers. Consequently, the light is more likely to be diffused, thus making it possible to produce a light emitting module that reduces unevenness in luminance. Such a configuration can be realized, for example, by providing a spacer(s) between arbitrary plural light-transmissive layers to separate these light-transmissive layers, thus forming an air layer(s) therebetween.

Alternatively, there may be provided a light-transmissive layer on the first main surface 1c of the light guide plate 1, and a layer having a different refractive index, for example, an air layer or the like, between the first main surface 1c of the light guide plate 1 and the light-transmissive layer. With this configuration, the light is more likely to be diffused, thus making it possible to produce a liquid crystal display device that reduces unevenness in luminance. Such a configuration can be realized, for example, by providing a spacer between an arbitrary light guide plate 1 and the light-transmissive layer to separate them from each other, thus forming the air layer or the like therebetween.

(Optically Functional Portion 1a)

The light guide plate 1 may include the optically functional portions 1a at the first main surface 1c.

The optically functional portions 1a can have, for example, the function of spreading light in the plane of the light guide plate 1. For example, each of the optically functional portions 1a is formed by a material having a refractive index different from the material of the light guide plate 1. Specifically, the optically functional portion is a concave portion provided at the first main surface 1c and has an inverted polygonal pyramid shape, such as an inverted cone, an inverted quadrangular pyramid, or an inverted hexagonal pyramid. The optically functional portion can be used to reflect light, which has been irradiated at an interface between the material (for example, air) having a different refractive index from the light guide plate 1 and an inclined surface of the concave portion, in the lateral direction of the light emitting element 11. For example, the optically functional portion may be formed by providing a light-reflective material or the like (for example, a reflective film made of metal or the like, and a white resin) in the concave portion with the inclined surface. The inclined surface of the optically functional portion 1a may be a straight line or a curved line in the cross-sectional view.

As will be mentioned later, the optically functional portion 1a is preferably provided at a position corresponding to each of the light emitting elements 11, that is, at a position opposite to the light emitting element 11 disposed on the second main surface 1d. In particular, the optical axis of the light emitting element 11 preferably coincides substantially with the optical axis of the optically functional portion 1a.

The size of the optically functional portions 1a can be set as appropriate. Each optically functional portion 1a shown in FIG. 2B is an inverted conical concave portion having a circular opening at the first main surface 1c by way of example. The diameter of the opening is substantially the same as the size of the wavelength conversion portion 12. The diameter of the opening is not limited to the same size as the wavelength conversion portion 12, and may be different from the size of the wavelength conversion portion 12.

(Positioning Portion, Concave Portion 1b)

The light guide plate 1 may include positioning portions 1b at the second main surface 1d.

Figure 3A:
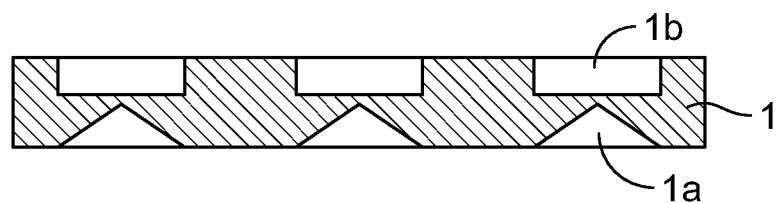
FIG. 3A is a partially enlarged schematic cross-sectional view showing an example of a manufacturing step of a light emitting module according to an embodiment of the present disclosure.

Each of the positioning portions 1b may have any form as long as it can serve as the target mounting position for the light emitting element 11. Specifically, the positioning portion can be a concave portion 1*b*, a convex portion, a groove, or the like as shown in FIGS. 2B and 3A.

The size of the concave portion 1*b* in the planar view can be set to, for example, 0.05 mm to 10 mm, and is preferably in a range of 0.1 mm to 1 mm. The depth of the concave portion 1*b* can be set to 0.05 mm to 4 mm, and is preferably in a range of 0.1 mm to 1 mm. The distance between the optically functional portion 1*a* and the concave portion 1*b* can be set as appropriate in a range that separates the optically functional portion 1*a* from the concave portion 1*b*.

The shape of the concave portion in the planar view can be, for example, substantially rectangular or substantially circular, and can be selected depending on an arrangement pitch between the concave portions or the like. When the arrangement pitch between the adjacent concave portions (the distance between the two closest concave portions) is substantially uniform, the shape of each concave portion in the planar view is preferably a substantially circular or a substantially square shape. Among them, the concave portions having the circular shape can expand the light from the light emitting element 11 satisfactorily.

(Diffusion Portion, Wavelength Conversion Portion)

The light emitting module of the present embodiment may include diffusion portions, each having a material of diffusing light from the light emitting element 11, and/or wavelength conversion portions for converting the wavelength of light from the light emitting elements 11.

Figure 4:
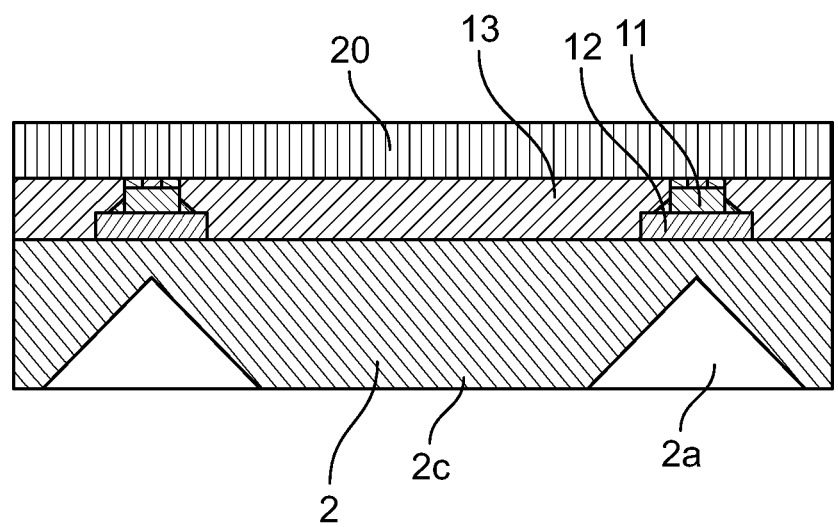
FIG. 4 is a partially enlarged schematic cross-sectional view of a light emitting module according to another embodiment of the present disclosure.

The diffusion portion and the wavelength conversion portion are provided between the light emitting element 11 and the light guide plate 1, and disposed at the second main surface 1*d* of the light guide plate 1. The diffusion portion and/or the wavelength conversion portion diffuse and uniformize therein the light from the light emitting element 11, irradiated thereat. As shown in FIG. 4, the diffusion portion and/or the wavelength conversion portion may be disposed on the second main surface 1*d* of the flat light guide plate 1 to protrude from the second main surface 1*d*. In addition, for the purpose of thinning the light emitting module 100 or the like, as shown in FIG. 2B, the diffusion portion and the wavelength conversion portion are preferably disposed within the concave portion 1*b* of the light guide plate 1 mentioned above.

In the present embodiment, the light emitting module 100 may include wavelength conversion portions 12. Further, the light emitting module preferably includes a plurality of wavelength conversion portions 12 spaced apart from each other. Thus, the wavelength conversion material can be saved. One wavelength conversion portion 12 is preferably provided for one of the light emitting elements 11. In this way, the light from the light emitting elements is uniformized in the wavelength conversion portion 12, thereby making it possible to reduce unevenness in luminance and color.

The wavelength conversion portion 12 can be formed by, for example, potting, printing, spraying, or the like. In a case where a wavelength conversion material is disposed in the concave portion 1*b* of the light guide plate 1 to form the wavelength conversion portion 12, for example, the liquid wavelength conversion material is placed on the second main surface 1*d* of the light guide plate 1 and then rubbed into a plurality of concave portions 1*b* by a squeegee or the like, so that the wavelength conversion portions 12 can be formed with good productivity.

Alternatively, a molded product, which has been previously molded, may be prepared as the wavelength conversion portion 12 and then may be disposed in the corresponding concave portion 1*b* of the light guide plate 1 or on the second main surface 1*d* of the light guide plate 1. A method of forming a molded product for the wavelength conversion portion 12 can include, for example, a method of singulating a plate-like or sheet-like wavelength conversion material by cutting, punching, or the like. Alternatively, a small-piece of the molded product of the wavelength conversion portion 12 can be formed by a molding method, such as injection molding, transfer molding, or compression molding, using a mold, a die, or the like. The molded product of the wavelength conversion portion 12 can be bonded to the inside of the concave portion 1*b* or on the second main surface 1*d* of the light guide plate 1 by using an adhesive or the like.

The size and shape of each wavelength conversion portion 12 may be, for example, the same as those of the above-mentioned concave portion 1*b*. The height of the wavelength conversion portion 12 may be preferably substantially the same as the depth of the concave portion 1*b*.

It is noted that the light guide plate 1 may have its part, other than the optically functional portions 1*a*, subjected to a process for causing light diffusion, reflection, and the like. For example, by providing fine asperities in a part spaced from the optically functional portions 1*a* or by roughening the part to form a rough surface, light can be further diffused to thereby reduce unevenness in luminance.

The wavelength conversion portion 12 can be formed using, for example, an epoxy resin, a silicone resin, a resin produced by mixing these resins, or a light-transmissive material, such as glass, as a material of a base material. From the viewpoint of the light resistance and ease of molding of the wavelength conversion portion 12, a silicone resin is advantageously selected as the base material of the wavelength conversion portion 12. As the base material of the wavelength conversion portion 12, a material having a higher refractive index than the material of the light guide plate 1 is preferable.

Examples of the wavelength conversion member contained in the wavelength conversion portion 12 include a YAG phosphor, a β-sialon phosphor, a fluoride-based phosphor, such as a KSF-based phosphor, and the like. In particular, when a plurality of kinds of wavelength conversion members is used in one wavelength conversion portion 12, and more preferably, when the wavelength conversion portion 12 includes a β-sialon phosphor that emits greenish light and a fluoride-based phosphor, such as a KSF-based phosphor, that emits reddish light, a color reproduction range of the light emitting module can be widened. Further, for example, the wavelength conversion portion 12 may contain 60% by weight or more, and preferably 90% by weight or more of a KSF-based phosphor (red phosphor) so that reddish light can be obtained when using the light emitting element 11 that emits bluish light. That is, a wavelength conversion member that emits light of a specific color may be contained in the wavelength conversion portion 12 to thereby emit light of the specific color. Alternatively, the wavelength conversion member may comprise quantum dots.

The wavelength conversion member may be arranged in the wavelength conversion portion 12 in an arbitrary manner. The wavelength conversion members may be substantially uniformly distributed or may be partially unevenly distributed. Alternatively, a plurality of layers, each containing a wavelength conversion member, may be laminated.

The diffusing portion suitable for use contains, for example, fine particles, such as $SiO_2$ or $TiO_2$, in the above-mentioned resin material.

(Light-Emitting Element 11)

A light emitting element 11 is a light source of the light emitting module 100. The plurality of light emitting elements 11 is joined to one light guide plate 1.

Each of the light emitting elements 11 has a main light-emitting surface 11c from which the emitted light is mainly extracted, and a pair of electrodes 11b formed on an electrode formation surface 11d opposed to the main light-emitting surface 11c. The pair of electrodes 11b is disposed to face a wiring board 20 to be mentioned later and is optionally connected electrically to substrate wiring located on the wiring board 20, via a wire 15 or the like as appropriate. The light emitting element 11 and the light guide plate 1 are joined together via a light-transmissive joining member 14 that has an adequate light-transmissive property, such as a light-transmissive resin.

Each light emitting element 11 includes, for example, a light-transmissive substrate made of sapphire or the like, and a semiconductor multilayer structure laminated on the light-transmissive substrate. The semiconductor multilayer structure includes a light emitting layer, and an n-type semiconductor layer and a p-type semiconductor layer which sandwich the light emitting layer therebetween. An n-side electrode and a p-side electrode 11b are electrically connected to the n-type semiconductor layer and the p-type semiconductor layer, respectively. In the light emitting element 11, for example, the main light-emitting surface 11c included in the light emitting substrate is disposed to face the light guide plate, and the pair of electrodes 11b is provided on the electrode formation surface 11d opposite to the main light-emitting surface 11c. The light emitting element 11 preferably includes a nitride semiconductor ($In_xAl_yGa_{1-x-y}N$, $0 \leq X$, $0 \leq Y$, $X+Y \leq 1$) that is capable of emitting light with a short wavelength that can efficiently excite a wavelength conversion member.

There is no particular limitation on the dimensions of the vertical, horizontal, and height of the light emitting element 11. The light emitting element 11 is preferably a semiconductor light emitting element that has vertical and horizontal dimensions of 1000 μm or less in the planar view, more preferably, a light emitting element having vertical and horizontal dimensions of 500 μm or less, and even more preferably, a light emitting element having vertical and horizontal dimensions of 200 μm or less. When local dimming of the liquid crystal display device is performed using such a light emitting element, a high-definition image can be realized. In addition, when the light emitting element 11 having the vertical and horizontal dimensions of 500 μm or less is used, the light emitting module 100 can be produced at low cost because the light emitting elements 11 can be obtained inexpensively. It is noted that in the light emitting element having both the vertical and horizontal dimensions of 250 μm or less, the area of an upper surface of the light emitting element becomes small, whereby the amount of light emitted from the side surfaces of the light emitting element becomes relatively large per size. That is, such a light emitting element is more likely to emit light in a bat wing shape, and thus is suitable for use in the light emitting module 100 of the present embodiment in which the light emitting elements 11 are joined to the light guide plate 1 with an extremely small distance between each light emitting element 11 and the light guide plate 1.

Further, the optically functional portion 1a, such as a lens, that has reflection and diffusion functions is preferably provided in the light guide plate 1 to spread the light from the light emitting element 11 toward the side of the light guide plate 1, thereby equalizing the intensity of light emission in the plane of the light guide plate 1. However, a small-sized light emitting element 11 and the corresponding optically functional portion 1a might be difficult to position in some cases when a plurality of optically functional portions 1a corresponding to the plurality of light emitting elements 11 is formed in the light guide plate 1. If the misalignment between the light emitting element 11 and the optically functional portion 1a occurs, the positional relationship between the light emitting element 11 and the optically functional portion 1a deviates from the design, so that the optically functional portion 1a cannot sufficiently spread the light, partially reducing the brightness of the liquid crystal panel in its plane, resulting in unevenness in luminance.

Particularly, the misalignment between the wiring board and the light emitting element and the misalignment of the optically functional portion in the light guide plate need to be considered in the planar direction and lamination direction in a conventional method that involves mounting the light emitting element on the wiring board and then combining the light guide plate with them. Thus, this method sometimes makes it more difficult to optically couple the light emitting element with the optically functional portion in a satisfactory manner.

For this reason, the light emitting module 100 according to the present embodiment can easily position the light emitting elements 11 by mounting the plurality of light emitting elements 11 on the light guide plate 1 using a plurality of positioning portions (particularly, the wavelength conversion portions 12) or optically functional portions 1a provided in advance on the light guide plate 1 as landmarks. Consequently, the light from the light emitting elements 11 can be uniformized across the light guide plate with high accuracy, thus producing a high-quality backlight source with little unevenness in luminance and color.

Further, as mentioned above, each positioning portion 1b capable of positioning the light emitting element 11 is preferably provided at a position corresponding to the optically functional portion 1a on a surface opposite to the surface provided with the optically functional portion 1a, that is, at a position overlapping with the optically functional portion 1a in the planar perspective projection. In particular, the concave portion 1b is formed as the positioning portion 1b, and the diffusion portion that allows a manufacturing device to identify the position of the light guide plate, more preferably, the wavelength conversion portion 12 is formed within the concave portion 1b by a member different from the light guide plate 1. This makes it possible to more easily position the light emitting elements 11 and the optically functional portions 1a.

In addition, the side surface of the light emitting element 11 is covered with a light-reflective member (sealing member 13) to limit the direction of light emission, and the diffusion portion or the wavelength conversion portion 12 is provided inside the concave portion 1b opposed to the main light-emitting surface 11c of the light emitting element 11, so that the light is extracted mainly from the diffusion portion or the wavelength conversion portion 12. Consequently, the diffusion portion capable of diffusing the light therein or the wavelength conversion portion 12 can be regarded as a light emitting portion. This can further reduce the influence by the misalignment of the light emitting element 11 that would occur within a range in the planar view, while the light emitting element 11 is opposed to the diffusion portion and the wavelength conversion portion 12.

As the light emitting element 11, a light emitting element having a rectangular shape in the planar view is preferably used. In other words, the light emitting element 11 preferably has a long side and a short side in the shape of its upper surface. For a high-definition liquid crystal display device, the number of used light emitting elements 11 is several thousands or more, and a mounting step of the light emitting element 11 becomes an important step. In the mounting step of the light emitting elements 11, even if a rotational deviation (for example, a deviation in the ±90 degree direction) occurs in some of the plurality of light emitting elements, such light emitting elements can be easily confirmed visually because the light emitting element in use has a rectangular shape in the planar view. Further, as a p-type electrode and an n-type electrode can be formed while being spaced from each other, the wire 15 to be mentioned later can be easily formed.

On the other hand, when using square light emitting elements in the planar view, small-sized light emitting elements can be mass-produced efficiently.

The density (arrangement pitch) of the light emitting elements 11, i.e., a distance between the adjacent light emitting elements 11, can be set to, for example, about 0.05 mm to 20 mm, and preferably about 1 mm to 10 mm.

The plurality of light emitting elements 11 is arranged one- or two-dimensionally in the planar view of the light guide plate 1. Preferably, as shown in FIG. 2A, the plurality of light emitting elements 11 is two-dimensionally arranged in two orthogonal directions, namely, in the x direction and the y direction. The arrangement pitch $p_x$ of the plurality of light emitting elements 11 in the x direction and the arrangement pitch $p_y$ thereof in the y direction may be the same or different in the x direction and in the y direction as shown in the example of FIG. 2A. The two directions of the arrangement may not be orthogonal to each other. The arrangement pitch in the x direction or the y direction is not limited to an equal interval, and may be an unequal interval. For example, the light emitting elements 11 may be arranged to have the interval therebetween wider from the center of the light guide plate 1 toward its periphery. The term pitch between the light emitting elements 11 refers to the distance between the optical axes of the adjacent light emitting elements 11.

The known semiconductor light emitting element can be utilized as the light emitting element 11. In the present embodiment, a light emitting diode is embodied as the light emitting element 11. The light emitting element 11 emits, for example, blue light. The light emitting element 11 may use a light source that emits white light. Light-emitting elements that emit different colored lights may be used as the plurality of light emitting elements 11. For example, the light emitting module 100 may include light emitting elements that respectively emit red, blue, and green lights, and thereby white light may be emitted by mixing the red, blue, and green lights therefrom.

As the light emitting element 11, an element that emits light at an arbitrary wavelength can be selected. For example, a light emitting element that uses a nitride-based semiconductor ($In_xAl_yGa_{1-x-y}N$, $0 \leq X$, $0 \leq Y$, $X+Y \leq 1$) or GaP can be utilized as the element that emits blue or green light. A light emitting element containing a semiconductor, such as GaAlAs or AlInGaP, can be used as the element that emits red light. Furthermore, a semiconductor light emitting element made of any material other than these materials mentioned above can also be used. Various emission wavelengths can be selected depending on the materials of semiconductor layers and a mixed crystal ratio thereof. The composition, emission color, size, and the number of the light emitting elements in use can be selected as appropriate in accordance with the purpose.

(Light-Transmissive Joining Member 14)

The light emitting element 11 may be joined to the light guide plate 1, and the diffusion portion or the wavelength conversion portion 12 by a light-transmissive joining member 14. In the present embodiment, the light-transmissive joining member 14 is provided between the main light-emitting surface 11c of the light emitting element and the light guide plate 1.

The light-transmissive joining member 14 transmits 60% or more and preferably 90% or more of the light emitted from each light emitting element 11. The light-transmissive joining member 14 has the function of propagating the light emitted from the light emitting element 11 to the light guide plate 1. Because of this, the light-transmissive joining member 14 can contain a diffusion member or the like, and may be configured only by a light-transmissive resin material that does not contain any light-diffusion member or the like.

The light-transmissive joining member 14 may cover a side surface of the light emitting element 11 (a surface connecting the main light-emitting surface 11c and the electrode formation surface 11d). Further, the light-transmissive joining member 14 preferably covers the side surface of the light emitting layer in the light emitting element 11. With this configuration, the light emitted toward the side surface of the light emitting element 11 is efficiently extracted into the light-transmissive joining member 14, thereby making it possible to enhance the luminous efficiency of the light emitting module 100. When the light-transmissive joining members 14 are provided to cover the side surfaces of the light emitting element 11, as shown in FIG. 2B, the light-transmissive joining member 14 is preferably formed in a shape that expands toward the light guide plate 1 in the cross-sectional view. Thus, the light emitted in the direction toward the side surface of the light emitting element 11 can be efficiently extracted toward the light guide plate 1.

When the light emitting element 11 includes a light-transmissive substrate, the light-transmissive joining member 14 preferably covers at least a part of the side surface of the light-transmissive substrate. Thus, the light propagated within the light-transmissive substrate and emitted therefrom in the lateral direction in the light emitted from the light emitting layer can be extracted upward. The light-transmissive joining member 14 preferably covers half or more the side surface of the light-transmissive substrate in its height direction, and is more preferably formed to be in contact with a side formed by the side surface of the light emitting element 11 and the electrode formation surface 11d.

Furthermore, the light-transmissive joining member 14 is preferably disposed within a range that is limited to an area from the outer edge of the diffusion portion or the wavelength conversion portion 12 to the inner side thereof in the planar view from the side of the first main surface 1c of the light guide plate 1. In this way, the light from the light emitting elements 11 can be efficiently incident on the diffusion portion and/or the wavelength conversion portion 12, thereby making it possible to reduce unevenness in luminance and color of light emission.

Materials suitable for use in the light-transmissive joining member 14 include light-transmissive, thermosetting resin materials, such as epoxy resins, silicone resins, and the like.

(Sealing Member 13)

The sealing member 13 in the present embodiment seals the side surfaces of the plurality of light emitting elements 11, the second main surface 1d of the light guide plate 1, and the side surfaces of the light-transmissive joining members 14. Thus, the light emitting elements 11 and the light guide plate 1 can be reinforced. Furthermore, the sealing member 13 is configured as the light-reflective member, so that the light emitted from the light emitting elements 11 can be efficiently extracted into the light guide plate 1. In addition, the sealing member 13 serves as both a member for protecting the light emitting elements 11 and a reflective member provided on the surface opposite to the emission surface of the light guide plate 1, so that the thinning of the light emitting module 100 can be achieved.

It is noted that as shown in FIG. 4, when the wavelength conversion portions 12 are provided on the second main surface of the light guide plate, and the side surfaces of each wavelength conversion portion 12 and the like are exposed from the light guide plate, the exposed parts of the wavelength conversion portion 12 are preferably covered with the sealing member 13.

The sealing member 13 is preferably a light-reflective member.

The sealing member 13 as the light-reflective member has a reflectance of 60% or more and preferably 90% or more with respect to the light emitted from the light emitting element 11.

Material of the sealing member 13 in the light-reflective member is preferably a resin containing a white pigment and the like. In particular, a silicone resin containing a titanium oxide is preferable. Thus, the light emitting module 100 can be produced at low cost by using a large amount of inexpensive raw materials, such as a titanium oxide, as the material, which could be used in a relatively large amount in order to cover one surface of the light guide plate 1.

(Wire 15)

The light emitting module 100 may be provided with wires 15 that are electrically connected to electrodes 11b of the plurality of light emitting elements 11. The wires 15 can be formed on a surface of the sealing member 13 or the like opposite to the light guide plate 1. By providing the wires 15, for example, a plurality of light emitting elements 11 can be electrically connected to each other, thereby easily forming a circuit required for local dimming or the like of the liquid crystal display device 1000.

Figure 3B:
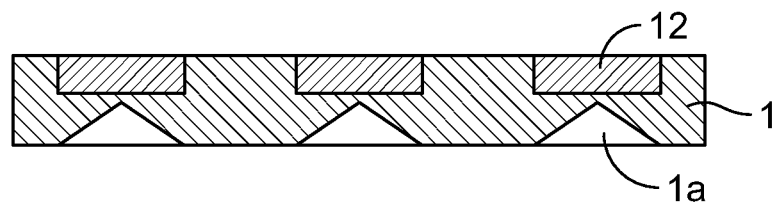
FIG. 3B is a partially enlarged schematic cross-sectional view showing an example of another manufacturing step of the light emitting module according to the embodiment.
Figure 3C:
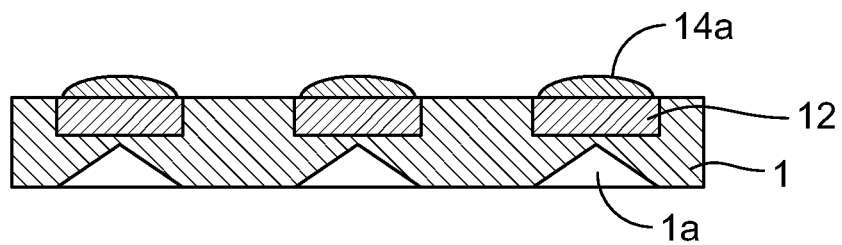
FIG. 3C is a partially enlarged schematic cross-sectional view showing an example of another manufacturing step of the light emitting module according to the embodiment.
Figure 3D:
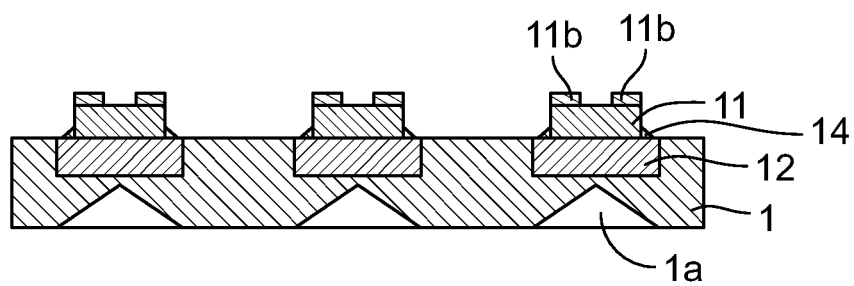
FIG. 3D is a partially enlarged schematic cross-sectional view showing an example of another manufacturing step of the light emitting module according to the embodiment.
Figure 3E:
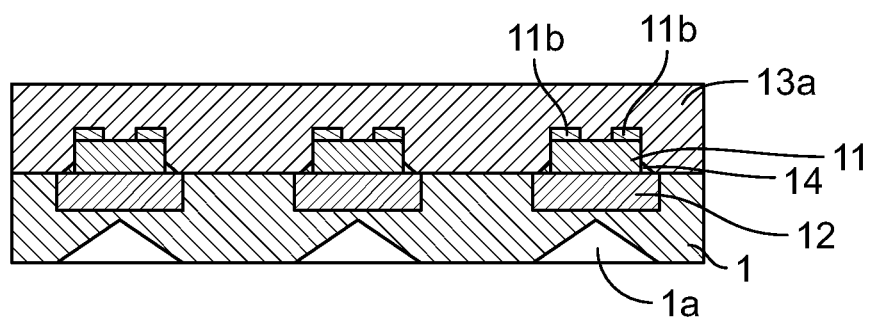
FIG. 3E is a partially enlarged schematic cross-sectional view showing an example of another manufacturing step of the light emitting module according to the embodiment.
Figure 3F:
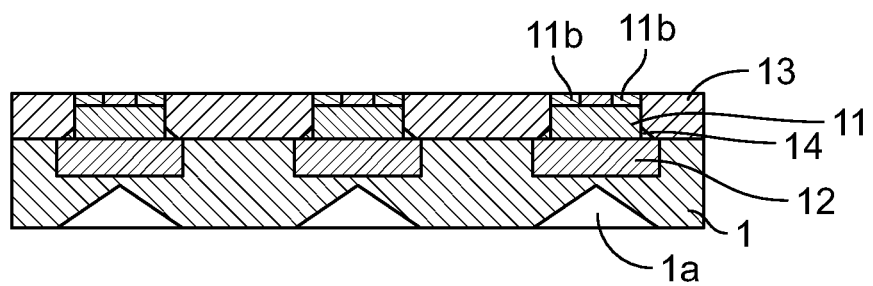
FIG. 3F is a partially enlarged schematic cross-sectional view showing an example of another manufacturing step of the light emitting module according to the embodiment.
Figure 3G:
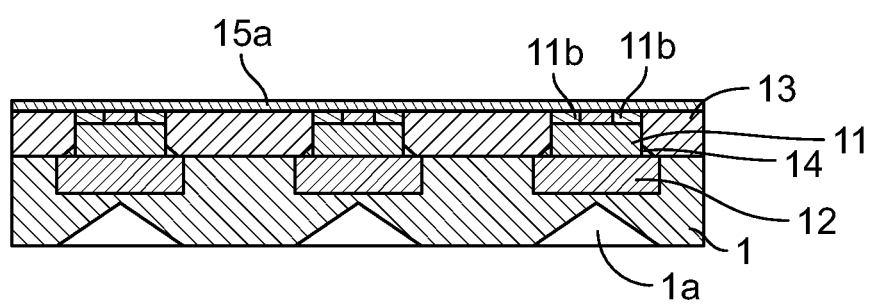
FIG. 3G is a partially enlarged schematic cross-sectional view showing an example of another manufacturing step of the light emitting module according to the embodiment.
Figure 3H:
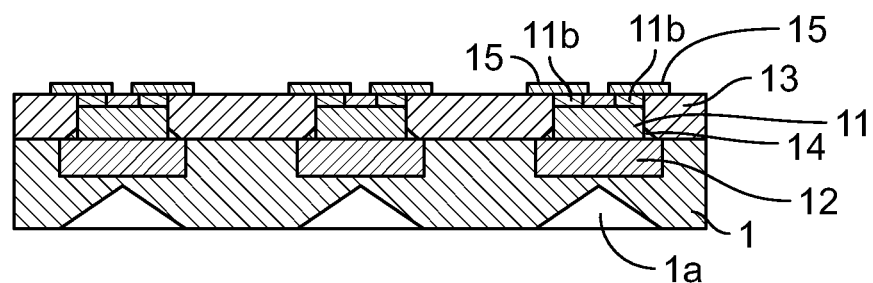
FIG. 3H is a partially enlarged schematic cross-sectional view showing an example of another manufacturing step of the light emitting module according to the embodiment.

For example, as shown in FIGS. 3G and 3H, the wires 15 can be formed by exposing the positive and negative electrodes 11b in each light emitting element 11 to the surface of the sealing member 13, forming a metal film 15a on substantially the entire surfaces of the electrodes 11b in the light emitting elements 11 and of the sealing member 13, and then patterning the metal film 15a through partial removal thereof with a laser or the like.

(Wiring Board 20)

Figure 3I:
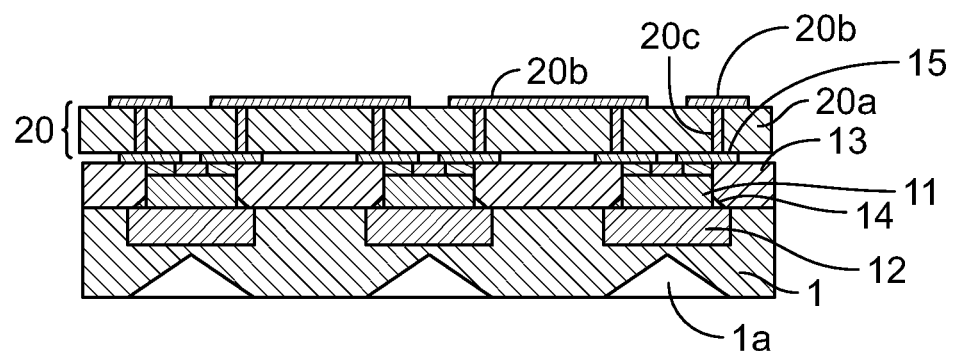
FIG. 3I is a partially enlarged schematic cross-sectional view showing an example of another manufacturing step of the light emitting module according to the embodiment.

As shown in FIG. 3I, the light emitting module 100 of the present disclosure may include the wiring board 20. This makes it possible to easily form complicated wiring required for local dimming or the like. The wiring board 20 can be configured by mounting the light emitting elements 11 on the light guide plate 1, optionally forming the sealing member 13 and the wires 15 thereover, and then joining the wiring board 20 separately having wiring layers 20b to the electrodes 11b of the light emitting elements or the wires 15. When the wires 15 are provided to be connected to the light emitting elements 11, by setting the size of each wire 15 larger than the size of the planar shape of the electrode 11b in the light emitting element 11, the wiring board 20 can be easily electrically connected to the light emitting elements 11 and the like.

The wiring board 20 is a substrate that includes an insulating base material 20a and the wiring layers 20b electrically connected to the plurality of light emitting elements 11, and the like. For example, in the wiring board 20, conductive members 20c are formed by filling in a plurality of via holes, which are provided in the insulating base material 20a, and the wiring layers 20b are formed to establish electric connection to the conductive members 20c at both surfaces of the base material 20a.

Material of the wiring board 20 may be any material. For example, any ceramic or resin can be used. Resin may be selected as the material of the base material 20a because of its low cost and ease of molding. Examples of the resin may include phenolic resins, epoxy resins, polyimide resins, bismaleimide-triazine (BT) resins, polyphthalamide (PPA), polyethylene terephthalate (PET), and composite materials, such as unsaturated polyesters and glass epoxies, and the like. The wiring board 20 may be a rigid substrate or a flexible substrate. In the light emitting module 100 of the present embodiment, the positional relationship between the light emitting element and the light guide plate is preset. Because of this, the problem of misalignment between the light emitting element 11 and the light guide plate 1 is less likely to occur even if the base material 20a in the wiring board 20 is formed using the material that tends to warp or stretch due to heat or the like. Thus, the substrate made of inexpensive material, such as a glass epoxy, or the thin substrate can be used as appropriate for the wiring board 20.

Each of the wiring layers 20b is, for example, a conductive foil (conductive layer) provided on the base material 20a. The respective wiring layers 20b are electrically connected to the plurality of light emitting elements 11. Material of the wiring layer 20b preferably has high thermal conductivity. Such a material is, for example, a conductive material, such as copper. The wiring layer 20b can be formed by plating, applying a conductive paste, printing, or the like. The thickness of the wiring layer 20b is, for example, approximately 5 to 50 µm.

The wiring board 20 may be joined to the light guide plate 1 or the like by any method. For example, an adhesive sheet is placed and press-bonded between the surface of the sealing member 13 provided on the side opposite to the light guide plate 1 and the surface of the wiring board 20, thereby enabling the wiring board 20 to be joined to the light guide plate 1. The wiring layer 20b in the wiring board 20 and the light emitting element 11 may be electrically connected together by any method. For example, the conductive member 20c, which is metal embedded in each via hole, can be melted by pressurizing and heating and thereby joined to the corresponding wire 15.

It is noted that the wiring board 20 may have a multilayer structure. For example, a metal plate having an insulating layer provided on its surface may be used as the wiring board 20. The wiring board 20 may be a thin-film transistor substrate that includes a plurality of TFTs.

FIGS. 3A to 3I show an example of a manufacturing method of a light emitting module of the present embodiment.

First, as shown in FIG. 3A, the light guide plate 1 is prepared. For example, a polycarbonate is used as the material of the light guide plate. The light guide plate has, on its first main surface, optically functional portions 1a, each of which is an inverted conical concave portion, and on its second main surface, concave portions 1b, each of which has a substantially quadrilateral opening.

Then, a wavelength conversion material that contains a mixture of a phosphor and a silicone resin is applied onto the second main surface side of the light guide plate 1 to fill the plurality of concave portions 1b by using a squeegee. An excess wavelength conversion material that does not fill in the concave portions 1b is removed. Then, the wavelength conversion material is cured to form a plurality of wavelength conversion portions 12 that are spaced apart from each other as shown in FIG. 3B.

Then, as shown in FIG. 3C, a liquid silicone resin, which is a material 14a of the light-transmissive joining member, is applied onto the respective wavelength conversion portions 12.

Subsequently, as shown in FIG. 3D, the light emitting elements 11, each including a light-transmissive sapphire substrate, are disposed on the respective materials 14a of the light-transmissive joining members. At this time, the light-transmitting element 11 is disposed such that the main light-emitting surface 11c located on the side of the sapphire substrate is directed toward the light guide plate 1, whereas the electrode formation surface 11d located on the side with the pair of electrodes 11b is directed toward the side opposite to the light guide plate 1. The materials 14a of the light-transmissive joining members are disposed at the light emitting element 11, especially at the side surfaces of the light emitting element 11 on the side of the sapphire substrate. Then, the materials 14a of the light-transmissive joining members are cured, so that the light emitting elements 11 are joined to and mounted on the light guide plate 1.

Then, as shown in FIG. 3E, a material 13a of the sealing member is formed to embed therein the second main surface 1d of the light guide plate 1, the plurality of light emitting elements 11, and the plurality of light-transmissive joining members 14. The material 13a of the sealing member is a light-reflective member that contains a mixture of a titanium oxide and a silicone resin. The material 13a of the sealing member is formed by, for example, transfer molding, potting, printing, spraying, or the like. At this time, the material 13a of the sealing member is formed thick to completely cover the upper surface (surface opposite to the light guide plate 1) of each electrode 11b of the light emitting elements 11. Subsequently, as shown in FIG. 3F, parts of the material 13a for the seal member are ground to expose the electrodes of the light emitting elements, thereby forming the sealing member 13.

Then, as shown in FIG. 3G, the metal film 15a made of Cu/Ni/Au is formed by sputtering on substantially the entire surface of the electrodes 11b of the light emitting elements 11 and the sealing member 13 from the side opposite to the light guide plate 1.

Subsequently, as shown in FIG. 3H, the metal film 15a is patterned by laser ablation to form the wires 15.

Finally, as shown in FIG. 3I, the wires 15 are press-bonded and joined to the wiring layers 20b of the wiring board 20, which have been prepared separately, via the adhesive sheet. At this time, the conductive material filled in part of the wiring layer 20b (for example, a via) is partially melted by pressurizing and heating to electrically connect the wires 15 and the wiring layers 20b.

In this way, the light emitting module 100 in the present embodiment can be obtained.

The plurality of light emitting elements 11 may be wired so as to be driven independently of one another. Alternatively, the light guide plate 1 may be divided into a plurality of ranges, and a plurality of light emitting elements 11 mounted in one of the divided ranges may be handled as one group. Further, the plurality of light emitting elements 11 located in one group may be electrically connected in series or in parallel with each other to be connected to the same circuit. Accordingly, the light emitting module may include a plurality of such light emitting element groups. By performing such grouping, the light emitting module can be provided that enables local dimming.

Figure 5A:
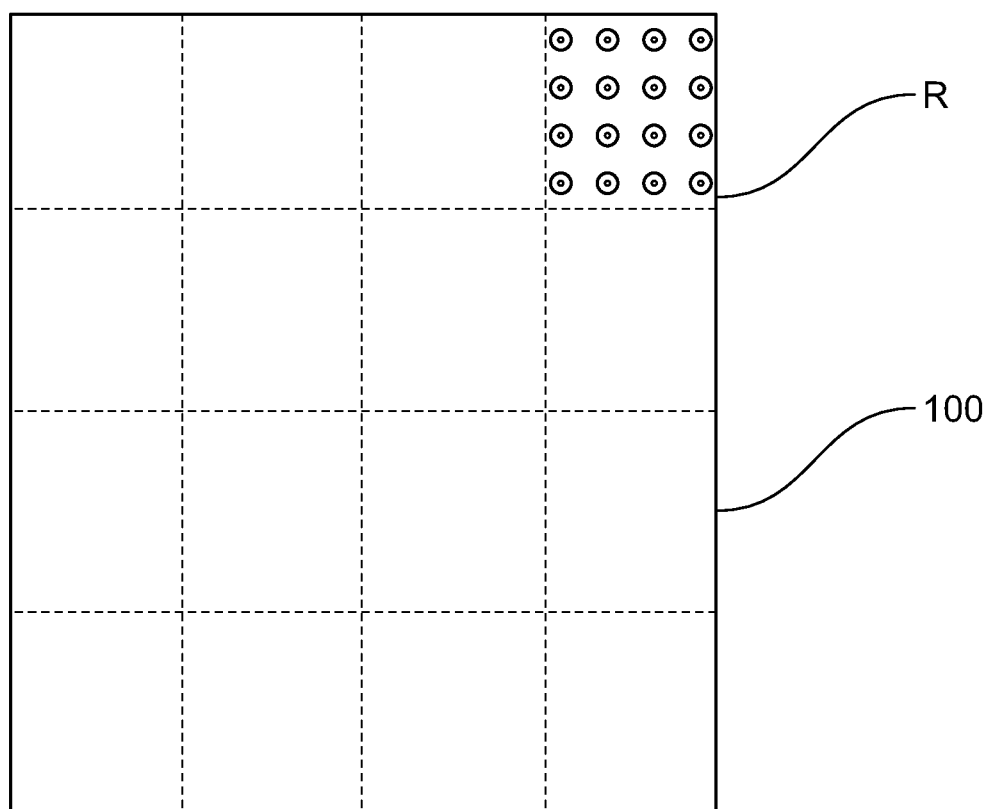
FIG. 5A is a schematic planar view of the light emitting module according to an embodiment of the present disclosure.
Figure 5B:
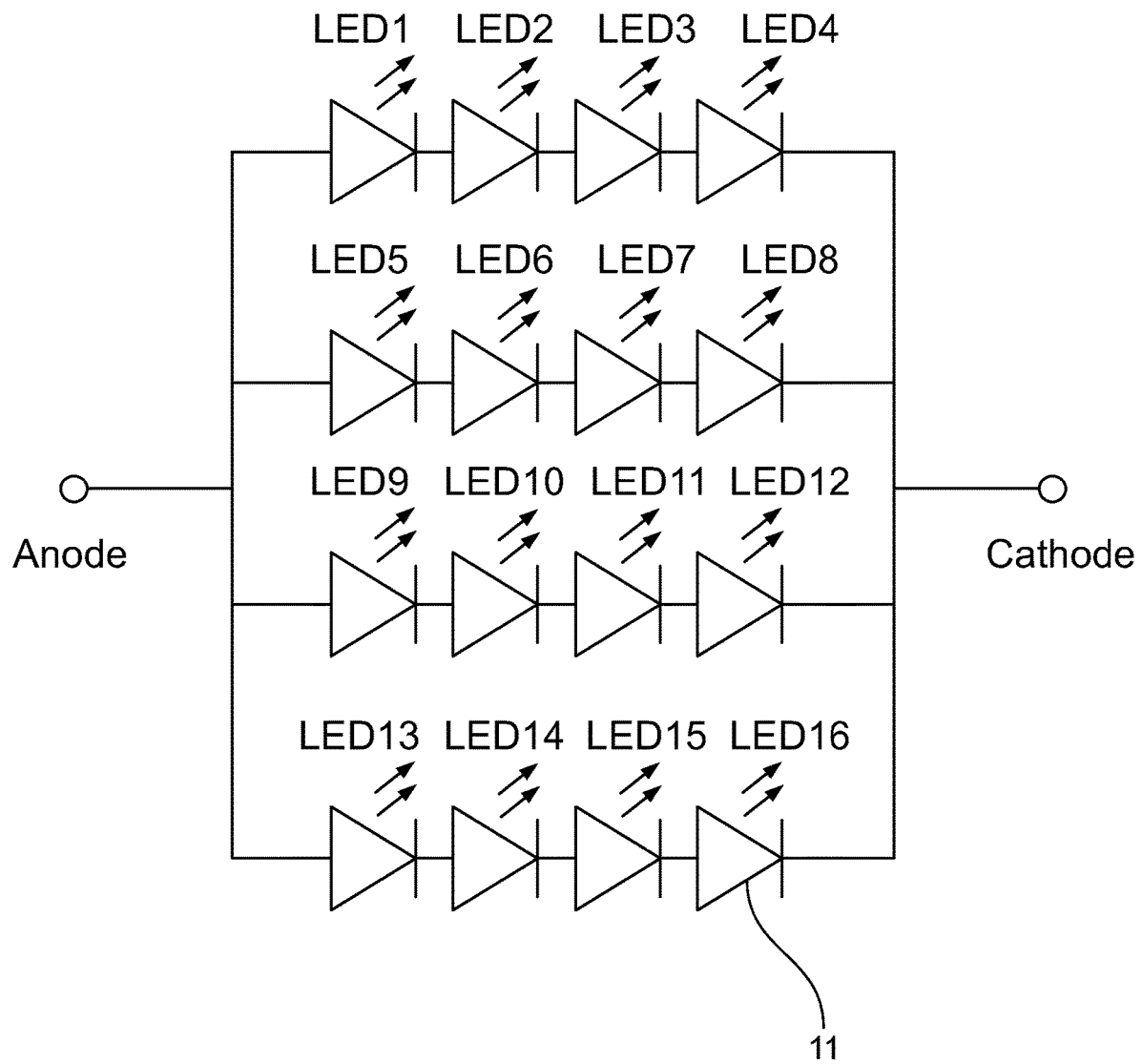
FIG. 5B is a circuit diagram showing a configuration of a light emitting module according to an embodiment of the present disclosure.

An example of such light emitting element groups will be illustrated in FIGS. 5A and 5B. In this example, as shown in FIG. 5A, the light guide plate 1 is divided into 16 regions R having four columns by four rows. This single region R contains 16 light emitting elements arranged in four columns by four rows. For example, the 16 light emitting elements are assembled and electrically connected together into a four-parallel four-series combination circuit shown in FIG. 5B.

One light emitting module 100 of the present embodiment may be used as a backlight for one liquid crystal display device 1000. Alternatively, a plurality of light emitting modules 100 may be arranged side by side and used as a backlight for one liquid crystal display device 1000. By fabricating a plurality of small-sized light emitting modules 100 and performing inspection or the like on them, the yield of the light emitting modules 100 can be improved, compared to the case of fabricating the light emitting module 100 mounted largely and having a number of light emitting elements 11.

One light emitting module 100 may be joined to one wiring board 20. Alternatively, the plurality of light emitting modules 100 may be joined to one wiring board 20. Thus, connection terminals to be used for electric connection with an external component (for example, connector 20e) can be consolidated into one terminal for each wiring substrate (that is, a terminal does not need to be prepared for each light emitting module 100). Thus, the structure of the liquid crystal display device 1000 can be simplified.

Further, a plurality of wiring boards 20, each having the plurality of light emitting modules 100 joined together thereon, may be arranged side by side to make a backlight for one liquid crystal display device 1000. At this time, for example, the plurality of wiring boards 20 are placed on a frame or the like, and can be respectively connected to an external power source by using the connectors 20e or the like.

Figure 6:
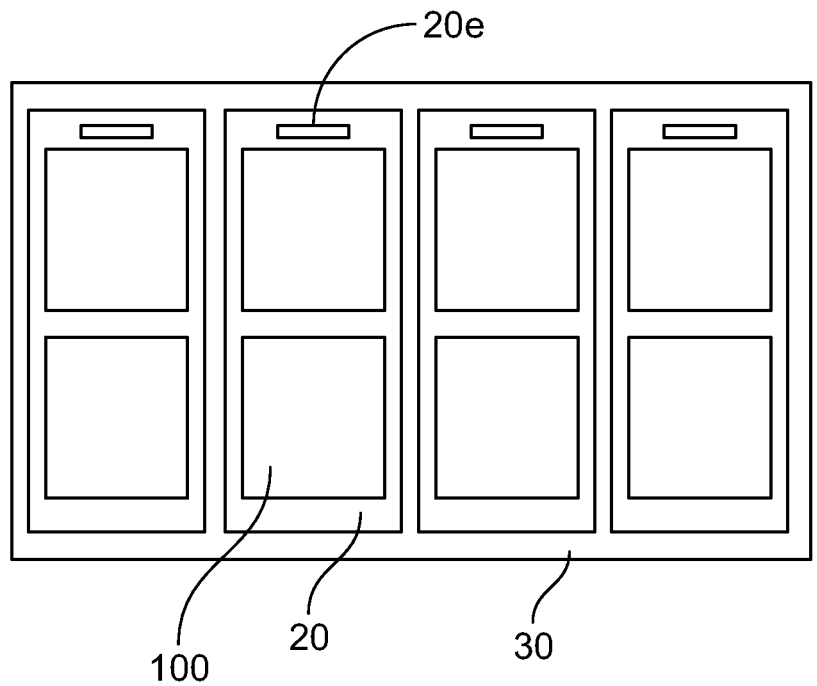
FIG. 6 is a schematic planar view showing the application of the light emitting modules to a liquid crystal display device according to an embodiment of the present disclosure.

FIG. 6 shows an example of a liquid crystal display device that includes such a plurality of light emitting modules 100.

In this example, four wiring boards 20, each including the connector 20e, are placed on a frame 30, and the two light emitting modules 100 are joined to each wiring board 20. That is, eight light emitting modules 100 are arranged in two rows by four columns. In this way, the backlight of a large-area liquid crystal display device can be manufactured inexpensively.

It is noted that a light-transmissive member having the function of diffusion or the like may be further laminated on the light guide plate 1. In such a case, when the optically functional portion 1a is a concave portion, the light-transmissive member is preferably provided to cover an opening of the concave portion (i.e., a part near the first main surface 1c of the light guide plate 1) and not to fill the concave portion. Consequently, an air layer can be provided within the concave portion of the optically functional portion 1a, thereby adequately spreading the light from the light emitting element 11.

1-1. First Modified Example of First Embodiment

Figure 7A:
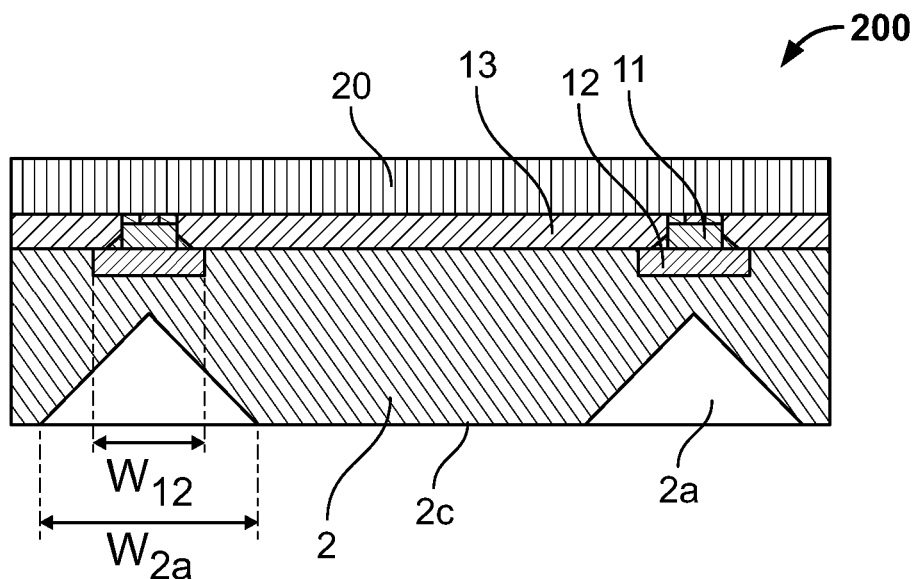
FIG. 7A is a partially enlarged schematic cross-sectional view of a light emitting module according to an embodiment of the present disclosure.
Figure 7B:
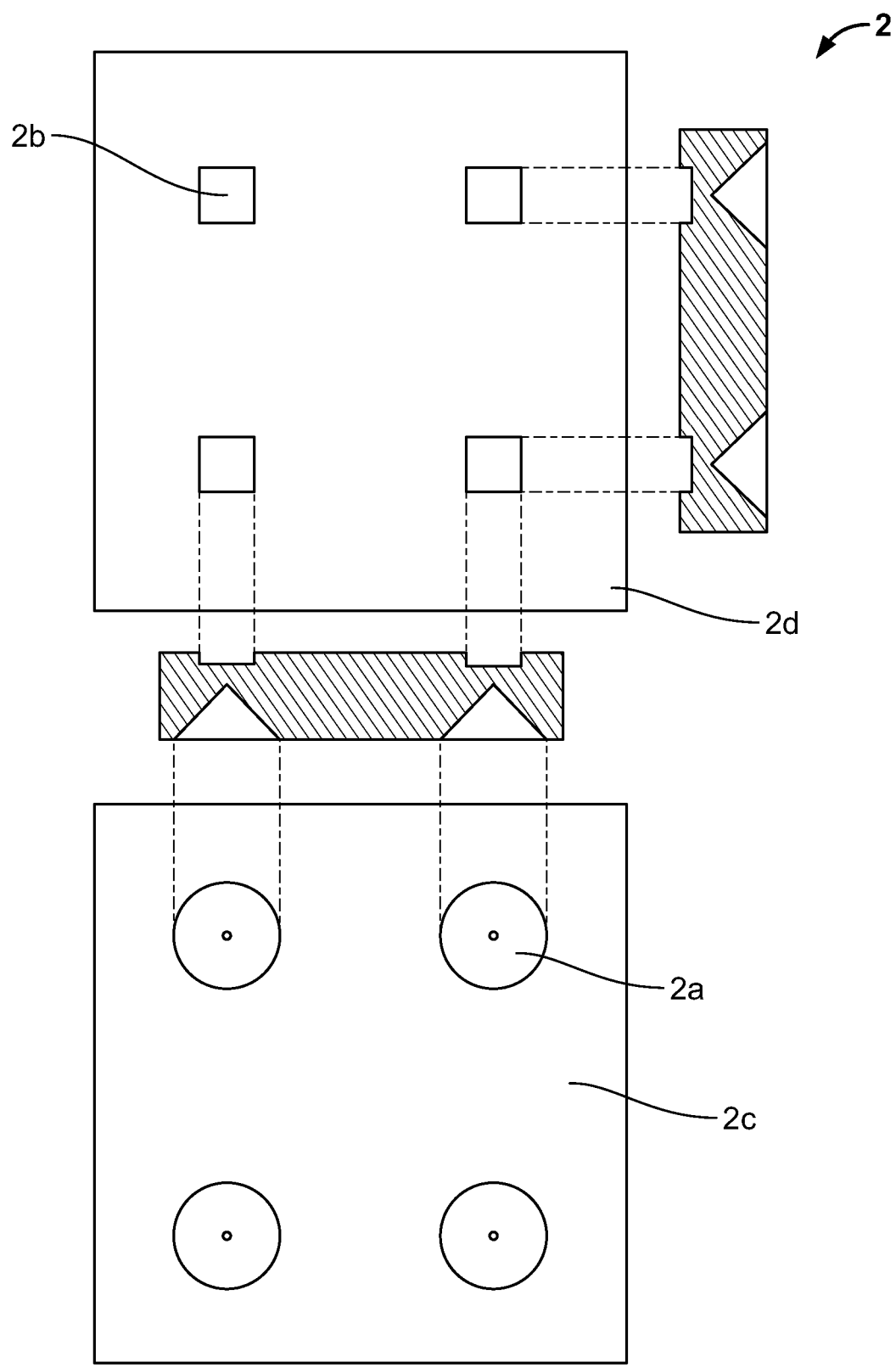
FIG. 7B shows a partially enlarged schematic planar view and a partially enlarged schematic cross-sectional view of an example of optically functional portions and concave portions in a light guide plate according to according to an embodiment of the present disclosure.

FIG. 7A is an enlarged cross-sectional view of a light emitting module 200 according to a first modified example. FIG. 7B respectively shows a top view, a longitudinal cross-sectional view, a bottom view, and a horizontal cross-sectional view of a light guide plate 2 used in the light emitting module 200. In the first modified example, the optically functional portion 2a provided on a first main surface 2c has a conical shape whose opening diameter $W_{2a}$ is larger than a width $W_{12}$ of the wavelength conversion portion 12. In this way, by increasing the opening diameter of the optically functional portion 2a, the light can be easily spread laterally, thus producing the light emitting module that can reduce unevenness in luminance.

1-2. Second Modified Example of First Embodiment

Figure 8A:
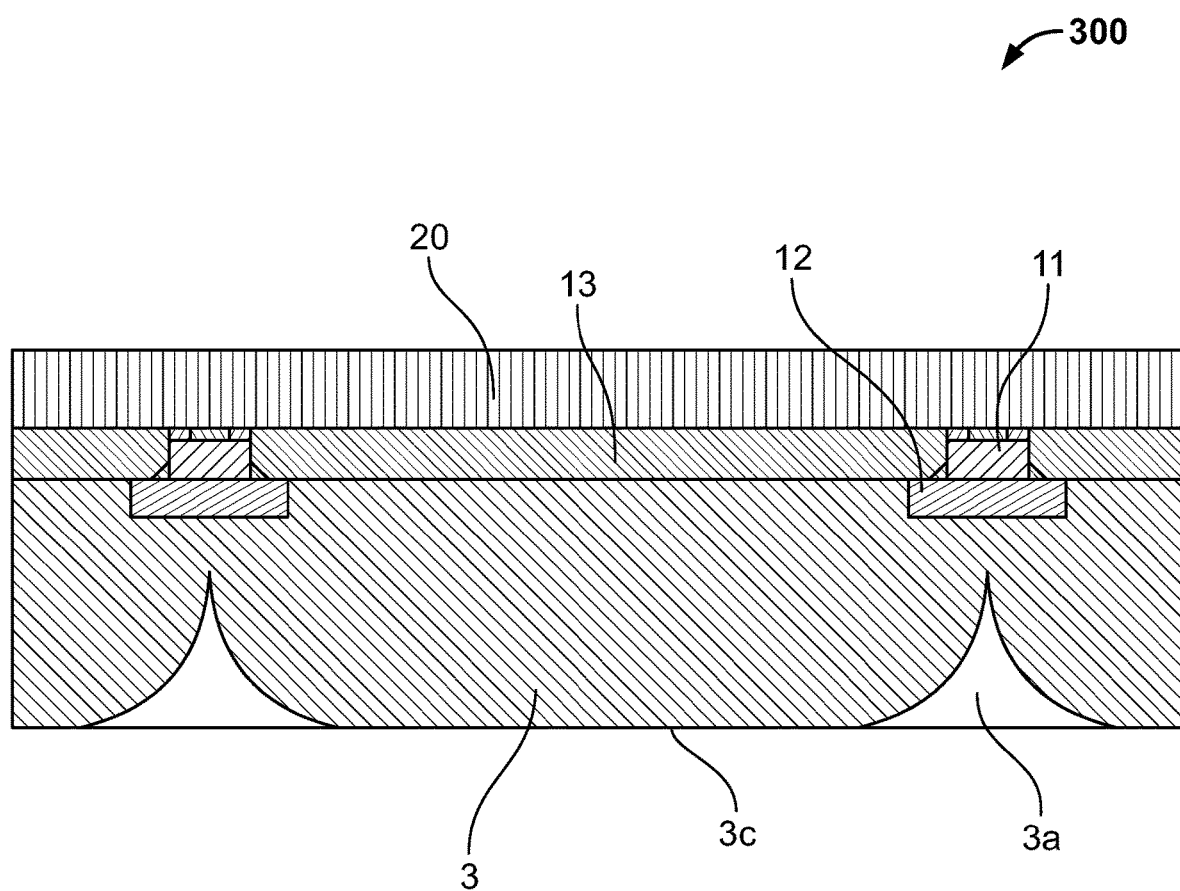
FIG. 8A is a schematic cross-sectional view of a light emitting module according to an embodiment of the present disclosure.
Figure 8B:
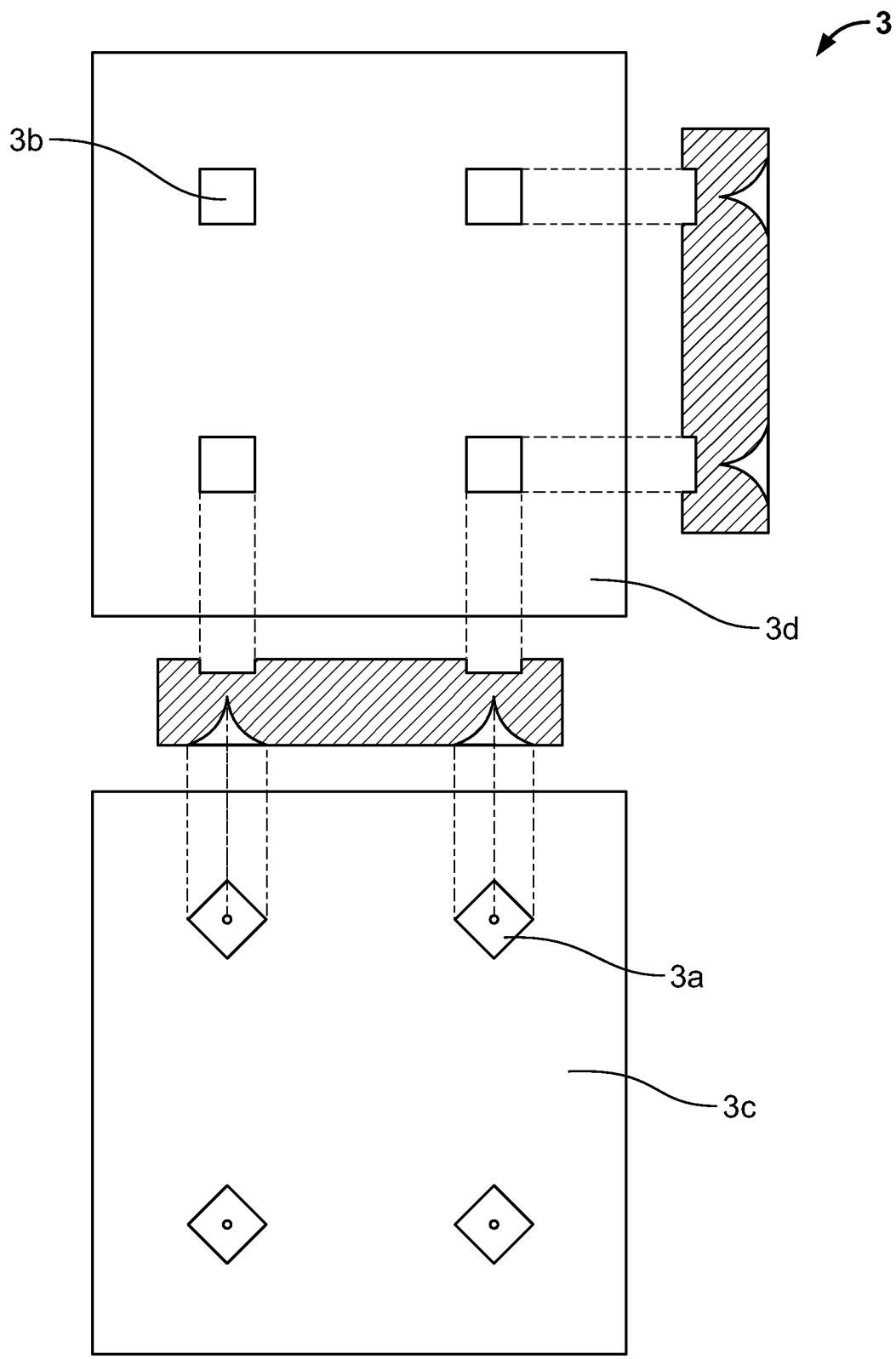
FIG. 8B shows a partially enlarged schematic planar view and a partially enlarged schematic cross-sectional view showing an example of optically functional portions and concave portions in a light guide plate according to according to an embodiment of the present disclosure.

FIG. 8A is an enlarged cross-sectional view of a light emitting module 300 according to a second modified example. FIG. 8B respectively shows a top view, a longitudinal cross-sectional view, a bottom view, and a horizontal cross-sectional view of the light guide plate 3 used in the light emitting module 300. In the second modified example, an optically functional portion 3a provided on a first main surface 3c has a conical shape whose side surface is a curved surface. In detail, the side surface is the curved surface formed in a convex shape toward its center. By forming the optically functional portions 3a with such a shape, the light can be easily spread laterally. A curvature radius R of the side surface of the optically functional portion 3a can be set to about a half the thickness of the light guide plate, for example, 0.4 mm to 0.5 mm.

1-3. Third Modified Example of First Embodiment

Figure 8C:
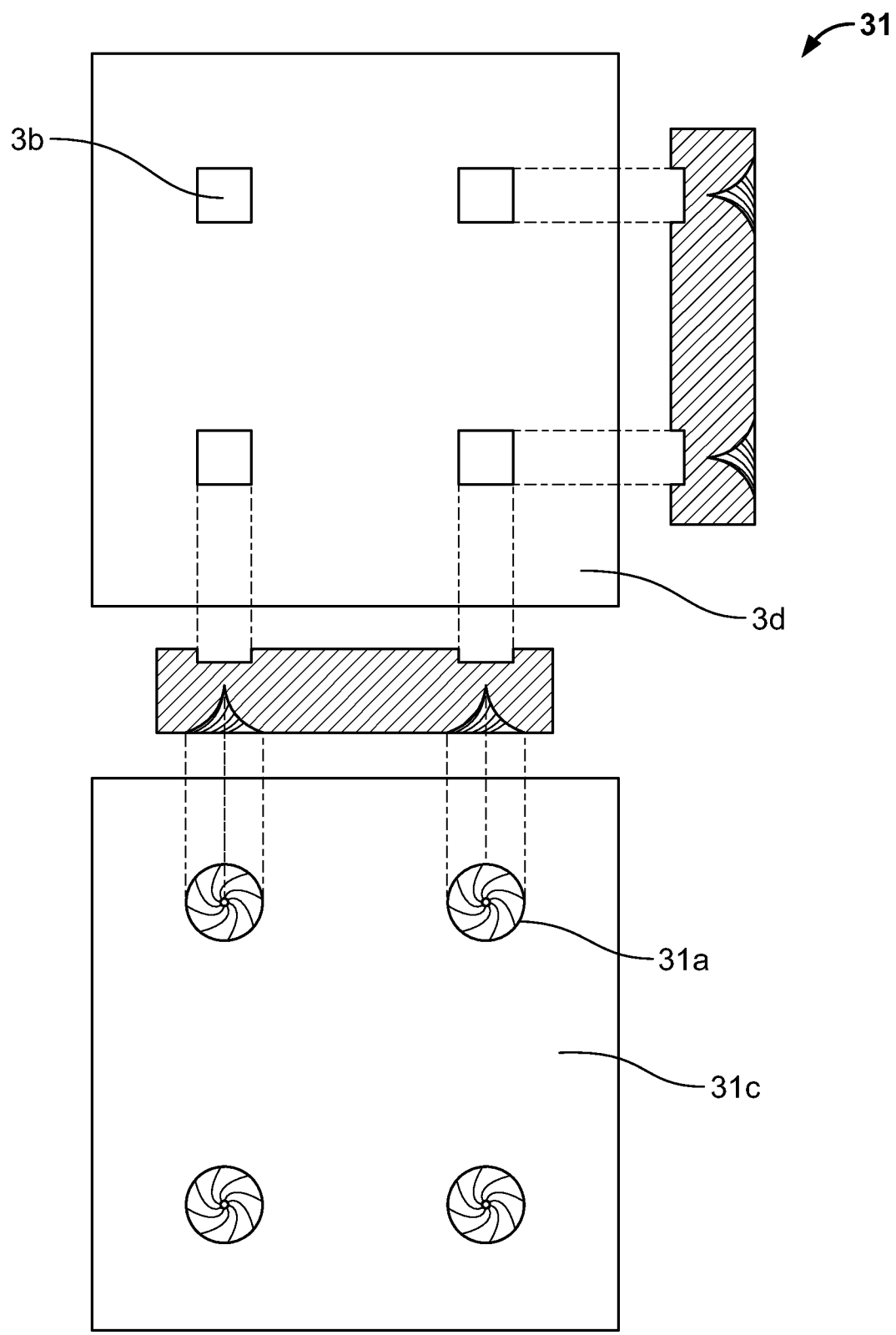
FIG. 8C shows a partially enlarged schematic planar view and a partially enlarged schematic cross-sectional view showing an example of optically functional portions and concave portions in a light guide plate according to an embodiment of the present disclosure.
Figure 8D:
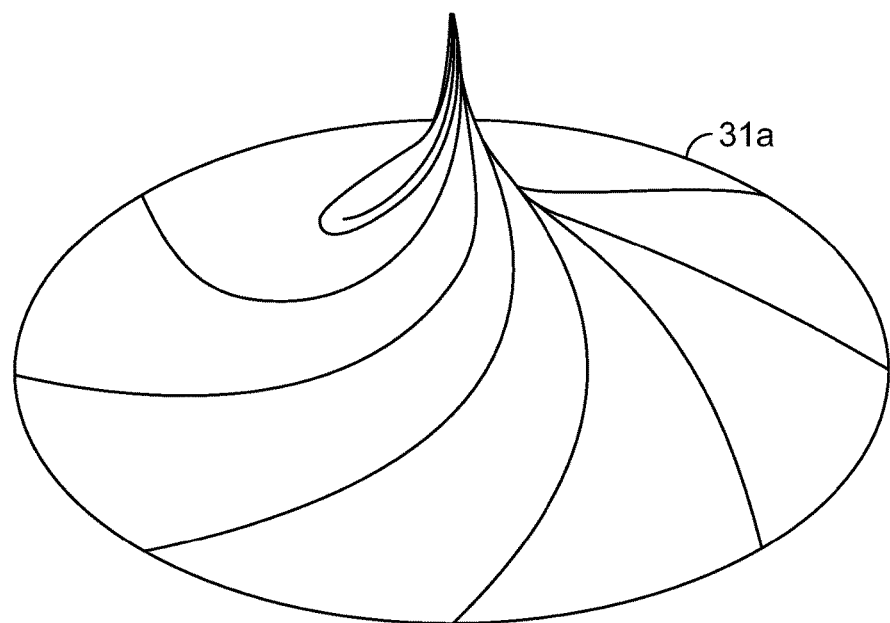
FIG. 8D is a partially enlarged perspective view of an optically functional portion in the light guide plate of the light emitting module according to an embodiment of the present disclosure.

FIG. 8C respectively shows a top view, a longitudinal cross-sectional view, a bottom view, and a horizontal cross-sectional view of a light guide plate 31 according to a third modified example. FIG. 8D is an enlarged perspective view of the optically functional portion 31a. In the third modified example, a second main surface 3d of the light guide plate 31 has a concave portion 3b in the same manner as in the second modified example and the like. The optically functional portion 31a of the first main surface 31c has a groove portion with a spiral side surface. As shown in FIG. 8D, the groove is formed to swirl. Thus, the light from the light emitting element can be more uniformly spread in the lateral direction.

2. Second Embodiment

Figure 9A:
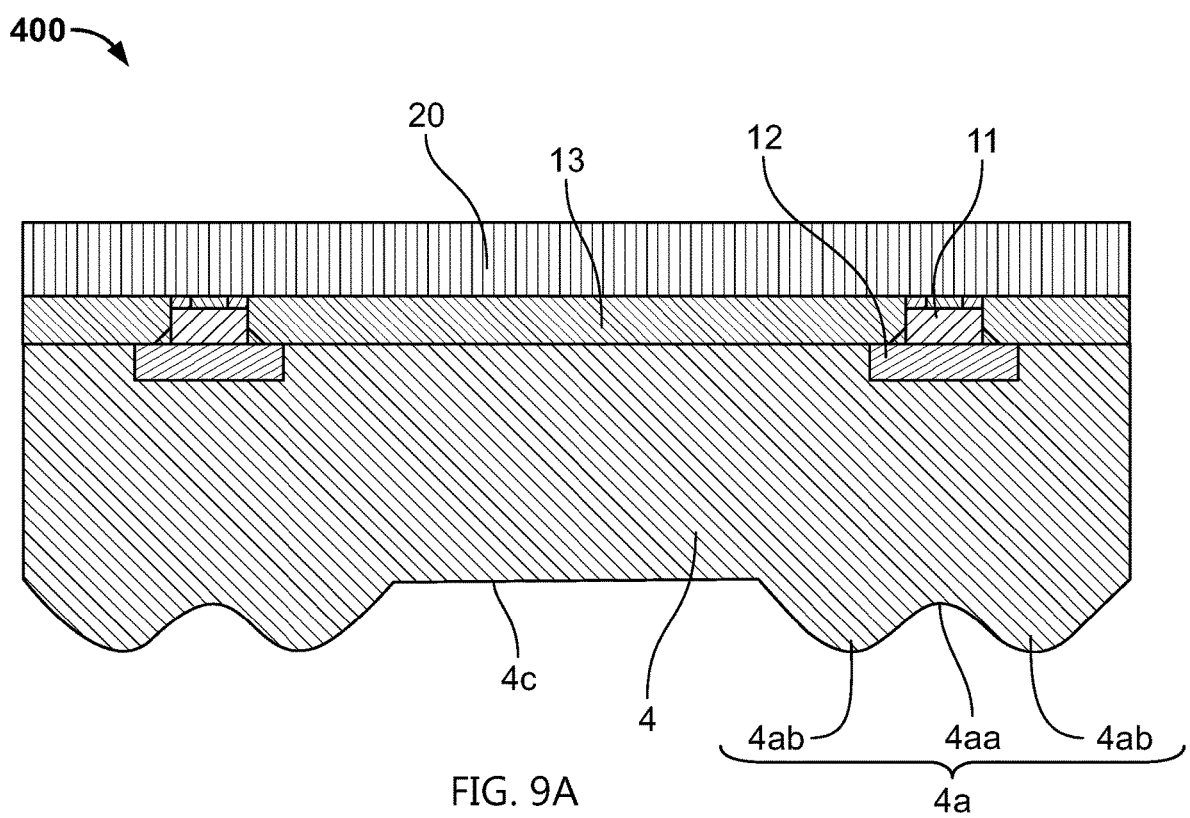
FIG. 9A is a schematic cross-sectional view of a light emitting module according to an embodiment of the present disclosure.
Figure 9B:
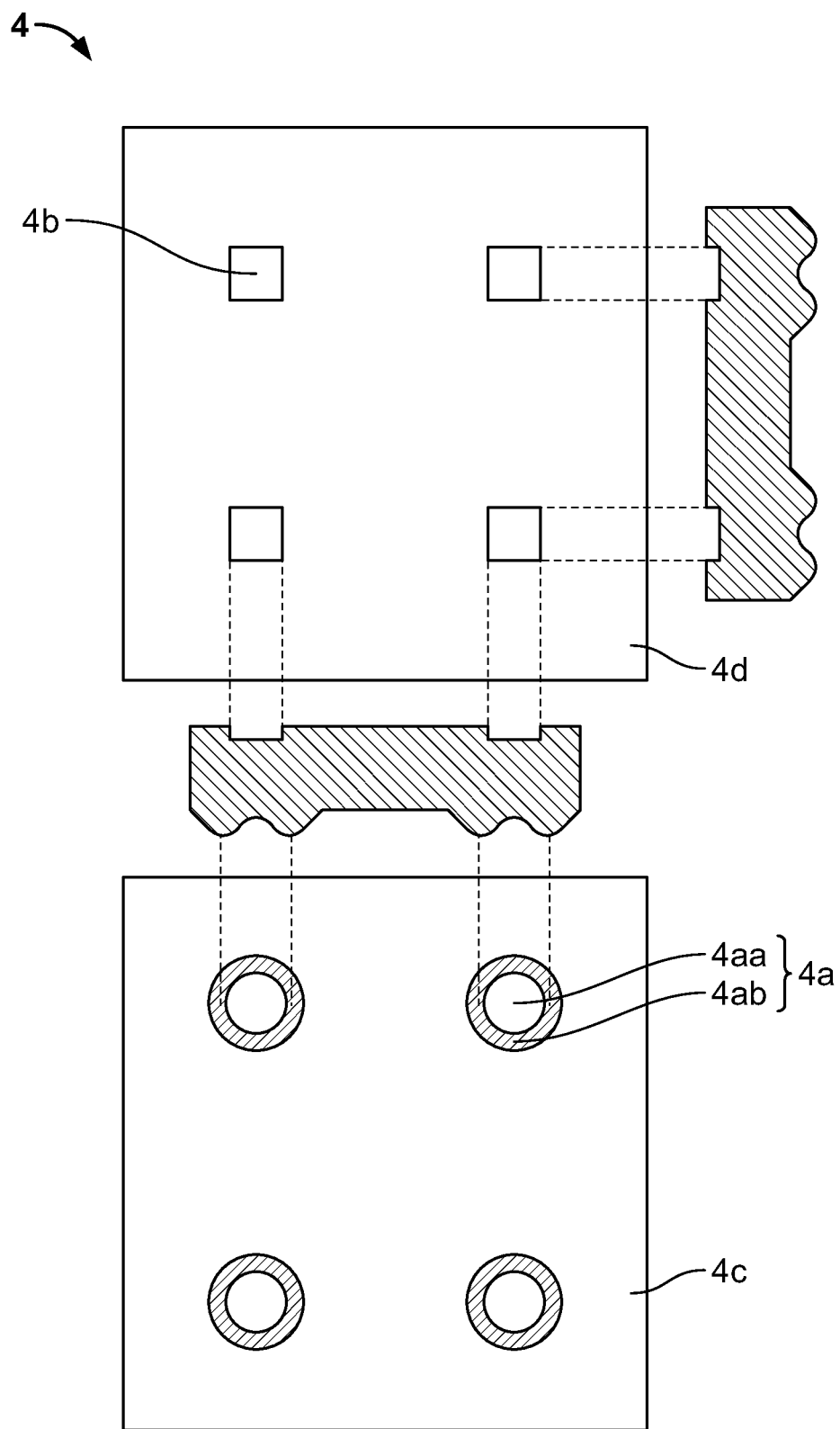
FIG. 9B shows a partially enlarged schematic planar view and a partially enlarged schematic cross-sectional view of an example of optically functional portions and concave portions in a light guide plate according to an embodiment of the present disclosure.

FIG. 9A is an enlarged cross-sectional view of a light emitting module 400 according to a second embodiment. FIG. 9B respectively shows a top view, a longitudinal cross-sectional view, a bottom view, and a horizontal cross-sectional view of a light guide plate 4 used in the light emitting module 400.

The light emitting module 400 according to the second embodiment differs from the light emitting module shown in FIGS. 2A, 2B and the like in the shape of the light guide plate 4 on the side of the first main surface 4c. Other members in the light emitting module of the present embodiment are substantially the same as those in the light emitting module of the first embodiment, and thus a description thereof will be omitted.

In the light emitting module 400 according to the second embodiment, an optically functional portion 4a includes central concave portions 4aa and annular convex portions 4ab surrounding the respective convex portions 4aa, on the first main surface 4c of the light guide plate 4.

Each of the central concave portions 4aa is preferably disposed at the center of the corresponding annular convex portion 4ab in the planar view. Further, the center of the central concave portions 4aa is preferably disposed to coincide with the center of the optically functional portion 4a in the planar view. Further, the center of the optically functional portion 4a and the central concave portions 4aa are preferably disposed to coincide with the center of the light emitting element 11.

The width and depth of the optically functional portion 4a, the width and depth of the central concave portions 4aa, and the width and depth of the annular convex portion 4ab can be changed as appropriate in accordance with the size, shape, and light distribution properties, and the like of the light emitting element 11 to be used. The target light distribution properties, and the size, depth, shape, and the like of the concave portion at the second main surface can also be changed as appropriate.

The central concave portion 4aa can be recessed in a hemispherical, semi-ellipsoidal, conical, parabolic-mirror-like shape, or the like. Alternatively, the central concave portion 4aa may be recessed in a conical shape with its vertex shaped into a curved surface.

For example, the width of the central concave portion 4aa (distance between the vertexes of two annular convex portions 4ab in the cross-sectional view) can be set to approximately 50% to 150% of the width of the light emitting element 11, and is preferably 80% to 120% thereof. The depth of the central concave portions 4aa can be set to, for example, approximately 1% to 50% of the thickness of the light guide plate 4, and is more preferably 1% to 10% thereof. The position of the deepest part of the central concave portions 4aa can be located at a height equal to, higher or lower than any region of the first main surface 4c except for the optically functional portion 4a. Preferably, the deepest part of the central concave portions 4aa can be located at the lower position than the first main surface 4c.

As shown in FIG. 9A, the annular convex portion 4ab can be formed in a convex shape with its vertex shaped into a curved surface in the cross-sectional view.

3. Third Embodiment

Figure 10A:
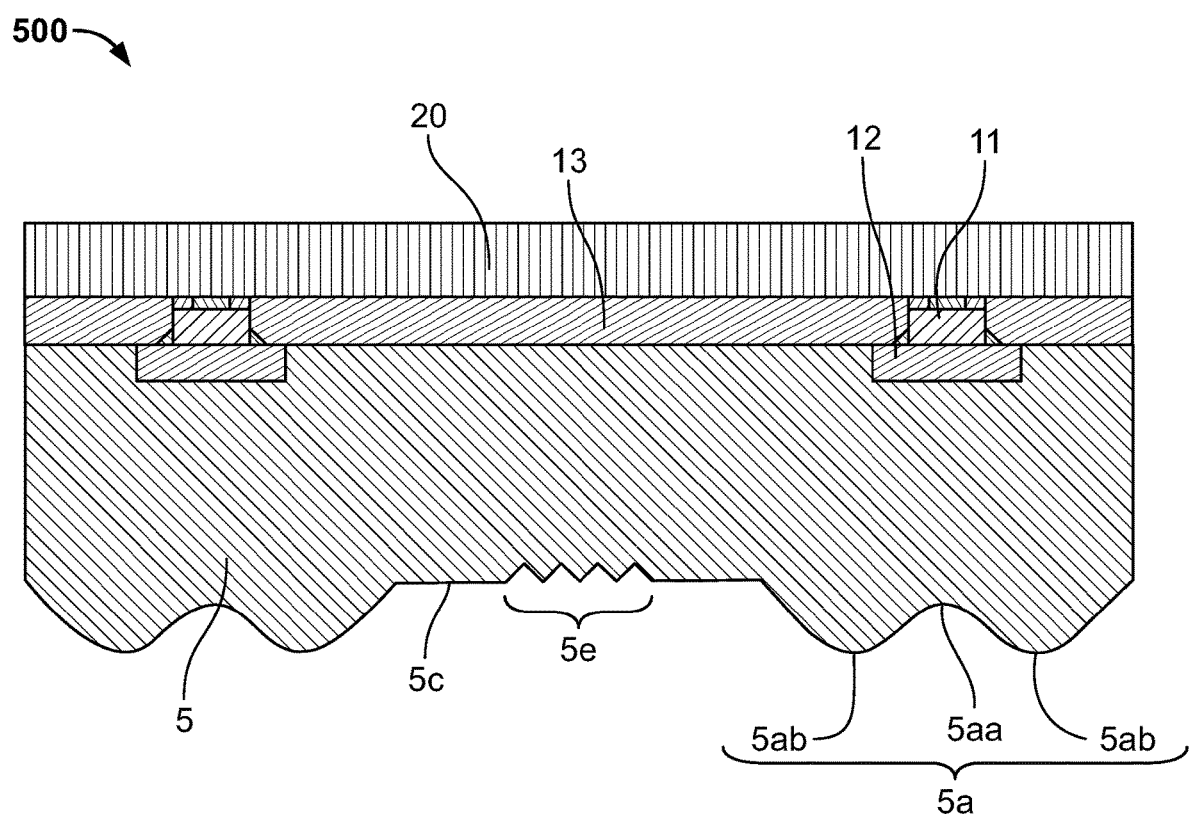
FIG. 10A is a schematic cross-sectional view of a light emitting module according to an embodiment of the present disclosure.
Figure 10B:
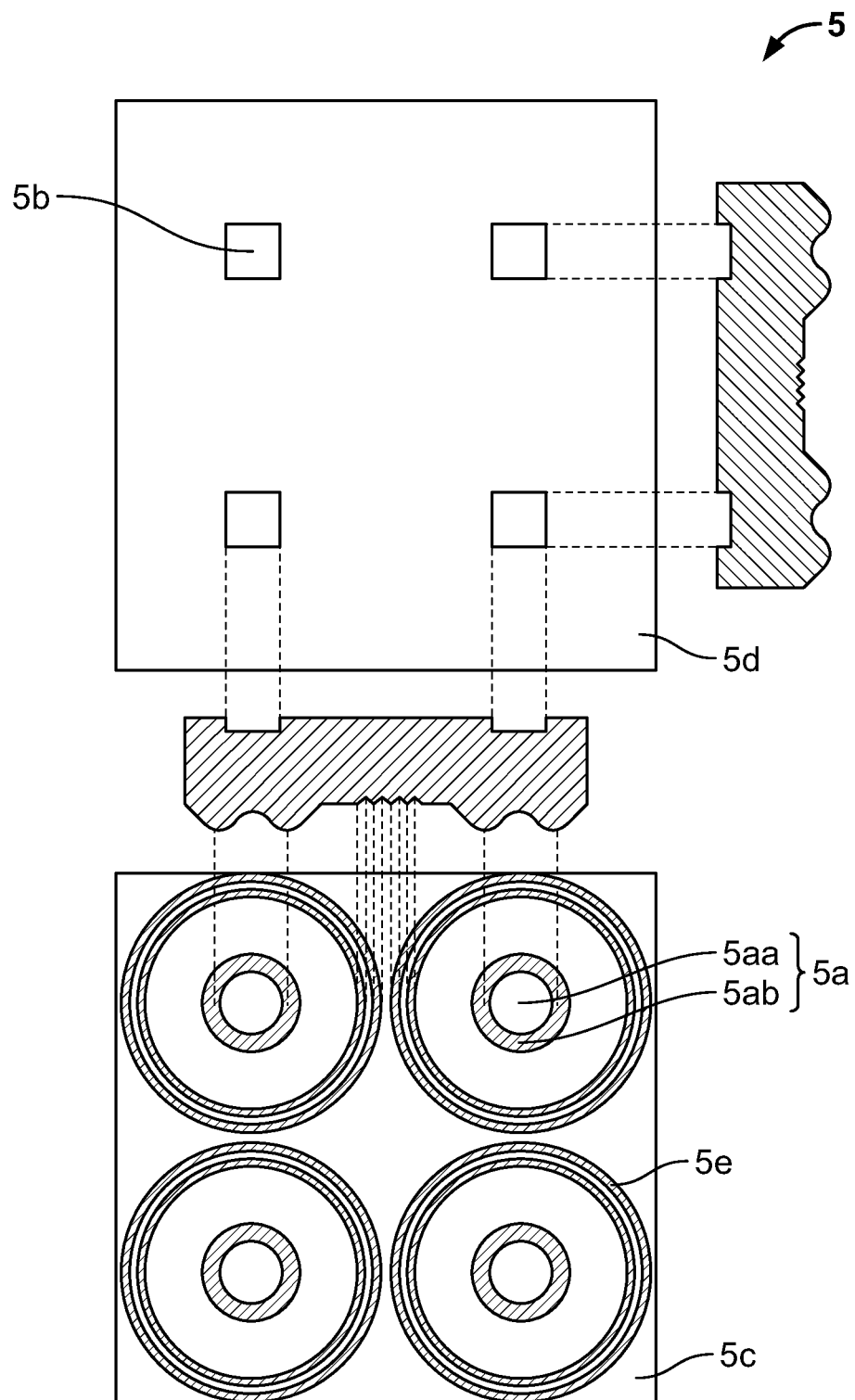
FIG. 10B shows a partially enlarged schematic planar view and a partially enlarged schematic cross-sectional view of an example of optically functional portions and concave portions in a light guide plate according to an embodiment of the present disclosure.

FIG. 10A is an enlarged cross-sectional view of a light emitting module 500 according to a third embodiment. FIG. 10B respectively shows a top view, a longitudinal cross-sectional view, a bottom view, and a horizontal cross-sectional view of a light guide plate 5 used in the light emitting module 500.

The light emitting module 500 according to the third embodiment differs from the light emitting module shown in FIGS. 9A and 9B in that a first main surface 5c of the light guide plate 5 includes light-scattering portions 5e, in addition to the optically functional portions 5a, each including a central concave portion 5aa and an annular convex portion 5ab. Other members in the light emitting module of the present embodiment are substantially the same as those of the light emitting module in the first embodiment, and thus a description thereof will be omitted.

The light emitting module 500 includes the light-scattering portions 5e, each being disposed in a part of the first main surface 5c between the two adjacent optically functional portions 5a, in addition to the optically functional portions 5a on the first main surface 5c of the light guide plate 5.

Each light-scattering portion 5e has the function of scattering the light through one or more concave or convex portions or the like. The light-scattering portion 5e is disposed at a position corresponding to an intermediate region between the adjacent light emitting elements 11 on the first main surface of the light guide plate. This region is a region where the light is the most difficult to reach, and that tends to become darker in surface luminance. By disposing the light-scattering portion 5e in such a region, the light from the light emitting element 11 can be uniformized with high accuracy, thus producing a backlight light source of good quality with little unevenness in luminance and color. Referring to FIG. 10B, each of the light-scattering portions 5e is formed concentrically relative to the optically functional portion 5a so as to surround the corresponding optically functional portion 5a.

4. Fourth Embodiment

Figure 11A:
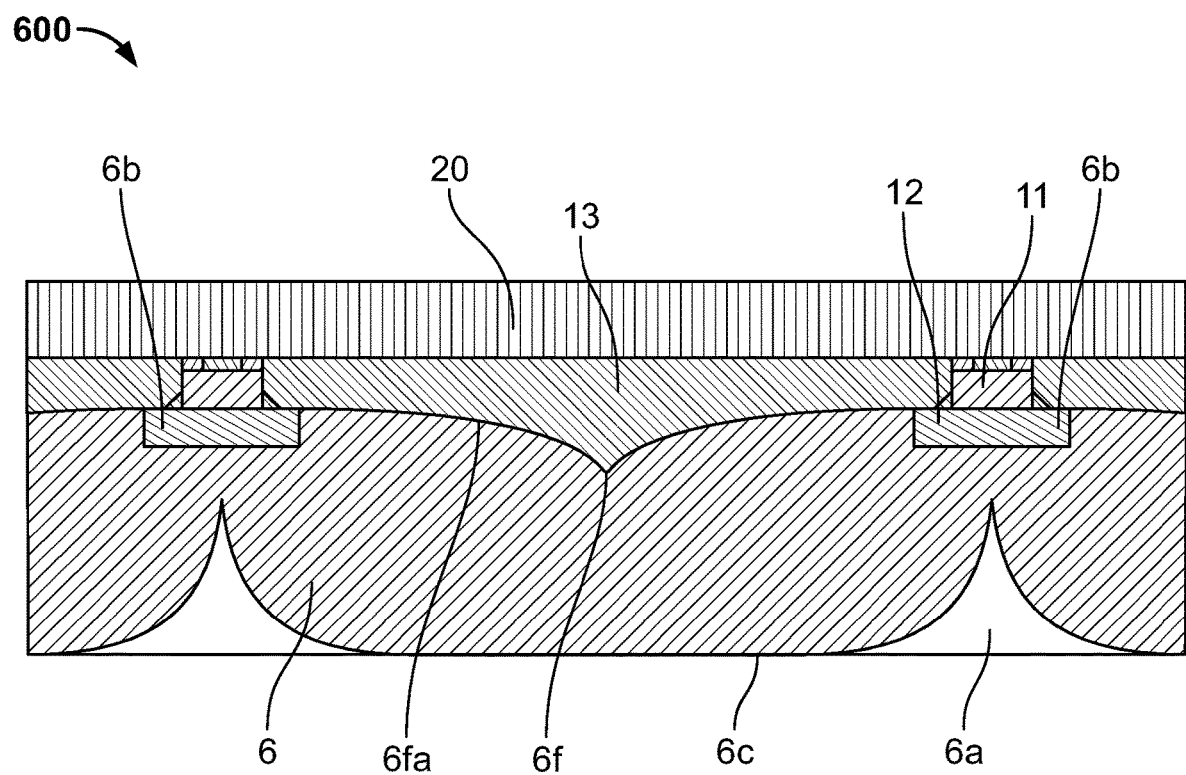
FIG. 11A is a schematic cross-sectional view of a light emitting module according to an embodiment of the present disclosure.
Figure 11B:
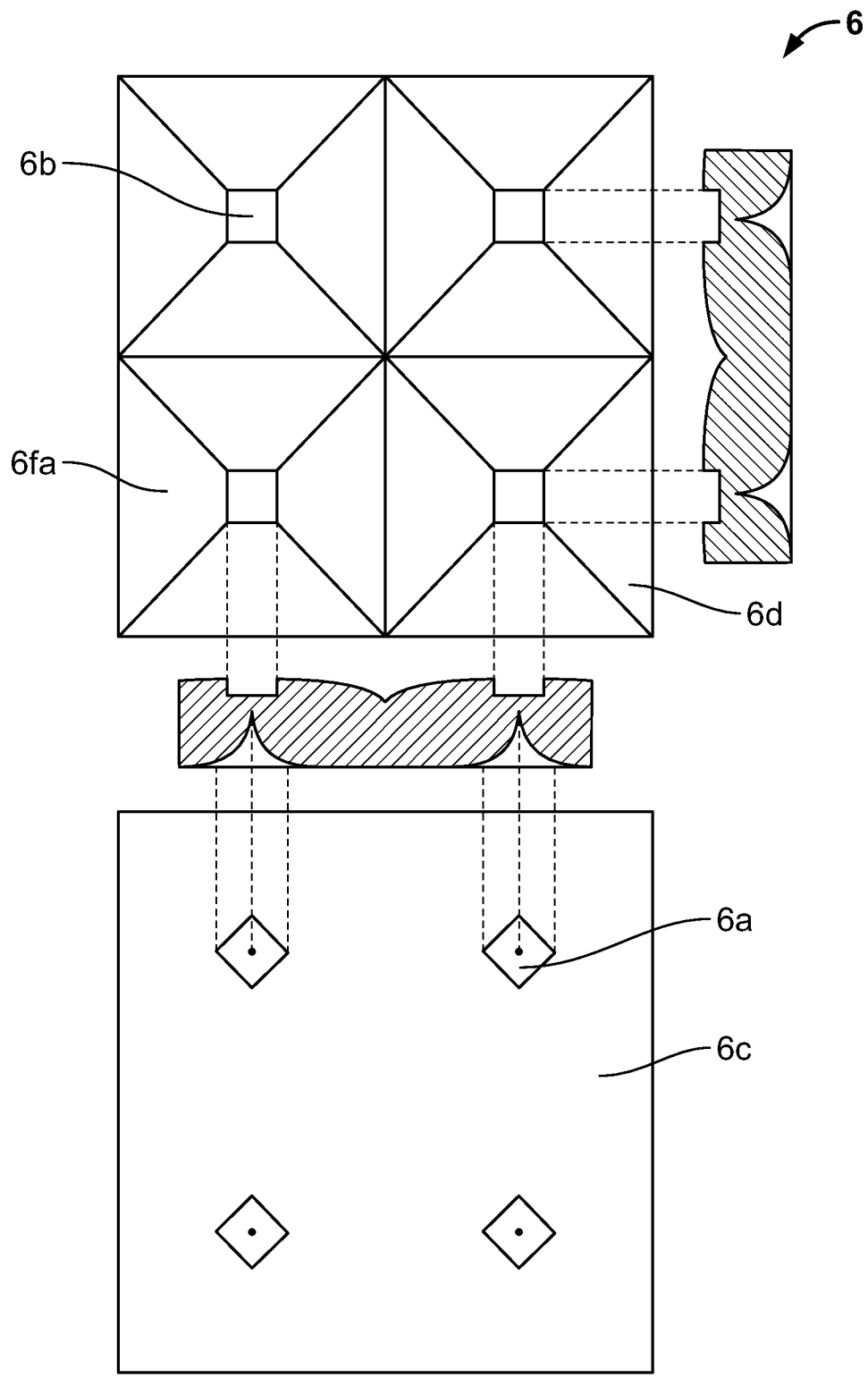
FIG. 11B shows a partially enlarged schematic planar view and a partially enlarged schematic cross-sectional view of an example of optically functional portions and concave portions in a light guide plate according to an embodiment of the present disclosure.

FIG. 11A is an enlarged cross-sectional view of a light emitting module 600 according to a fourth embodiment. FIG. 11B respectively shows a top view, a longitudinal cross-sectional view, a bottom view, and a horizontal cross-sectional view of a light guide plate 6 used in the light emitting module 600.

The light guide plate 6 in the light emitting module 600 according to the fourth embodiment includes light-reflective concave portions 6f in the second main surface 6d. Each light-reflective concave portion 6f is directed toward the light emitting element 11, and includes a light-reflective surface 6fa that reflects the light from the light emitting element 11. The light-reflective surface 6fa is a curved surface and is the deepest substantially at the center between the two concave portions 6b. In the fourth embodiment, substantially the entire region of the second main surface other than the concave portions 6b is illustrated as a curved surface, so that the light from the light emitting elements 11 can be efficiently reflected. It is noted that the above-mentioned entire region of the second main surface is not limited thereto and may have a flat surface. FIG. 11A shows an example in which the light-reflective concave portions 6f is deeper than the concave portion 6b. Thus, the light from the light emitting elements 11 can be efficiently reflected to make the surface luminance uniform.

5. Fifth Embodiment

Figure 12A:
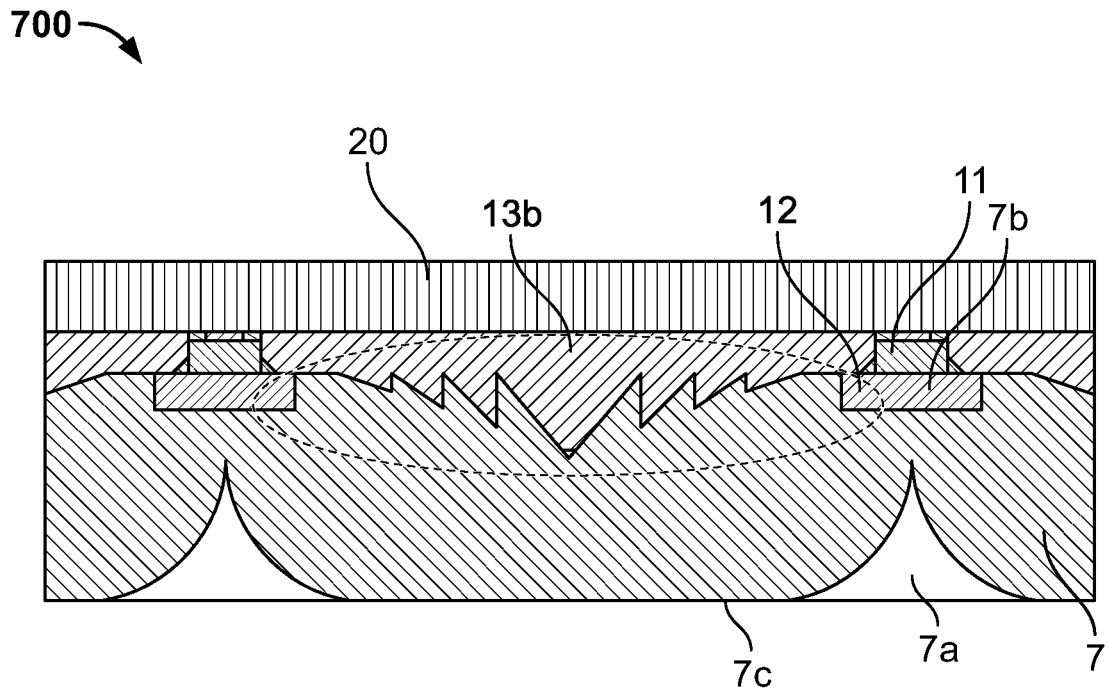
FIG. 12A is a schematic cross-sectional view of a light emitting module according to an embodiment of the present disclosure.
Figure 12B:
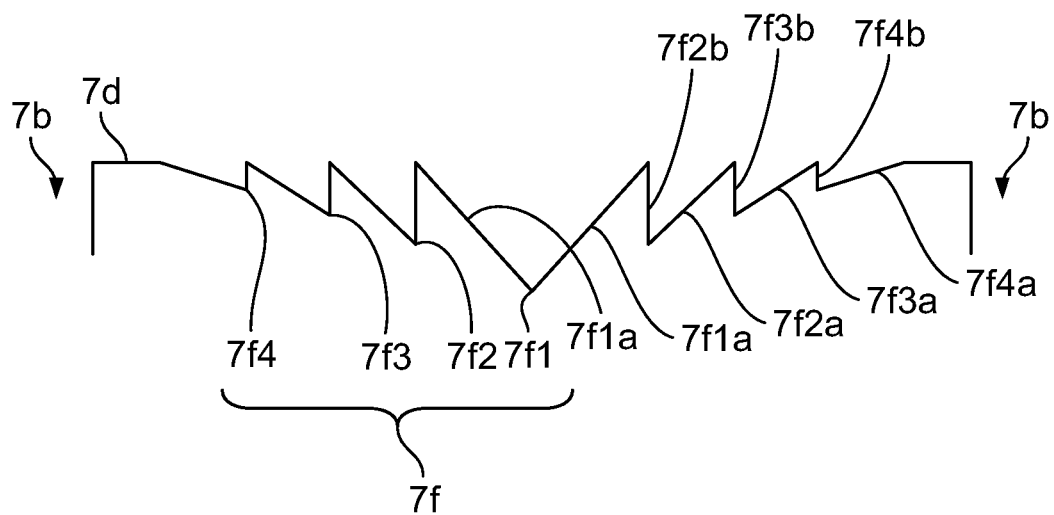
FIG. 12B is a partially enlarged schematic cross-sectional view of a light guide plate in a light emitting module according to an embodiment of the present disclosure.
Figure 12C:
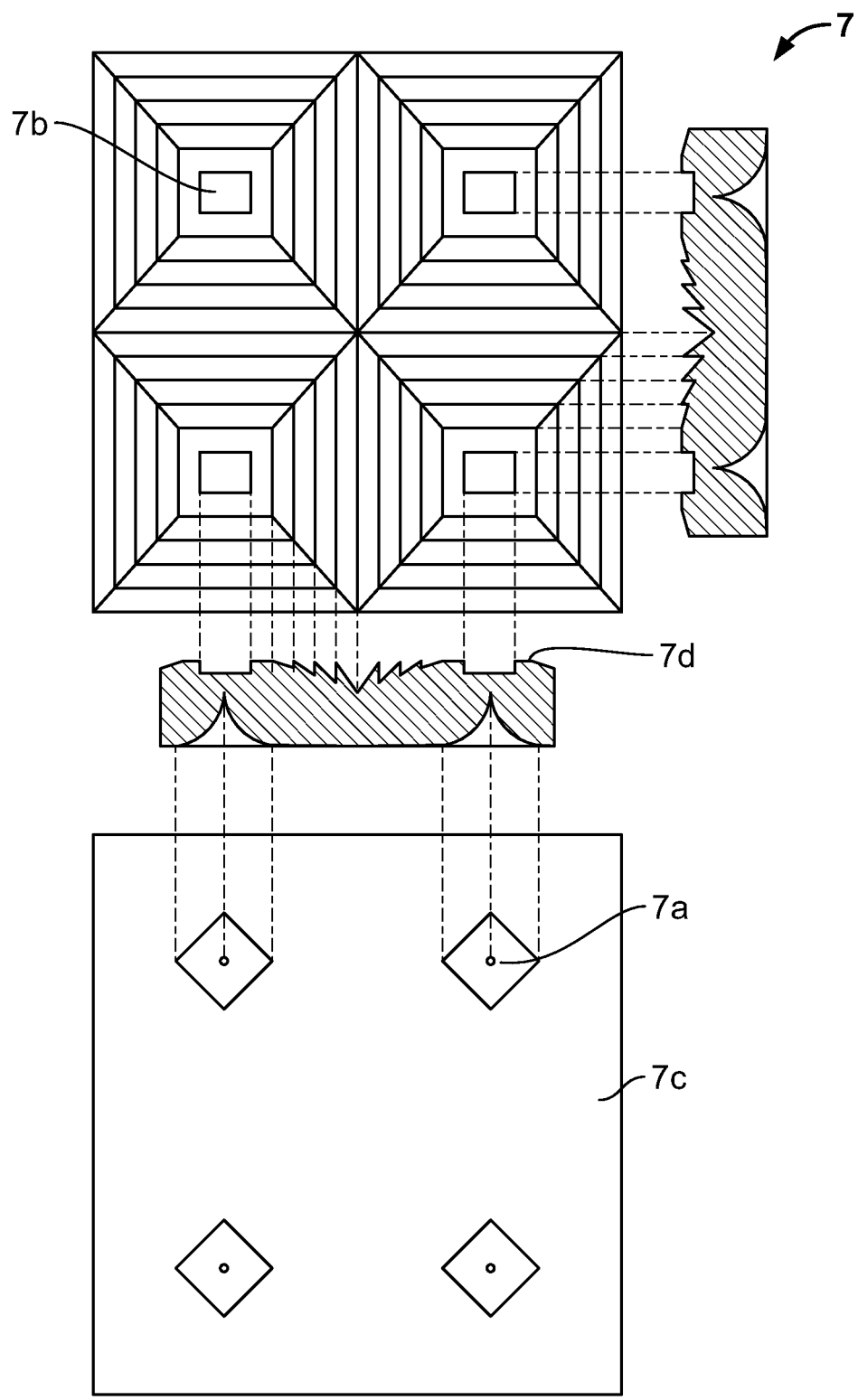
FIG. 12C shows a partially enlarged schematic planar view and a partially enlarged schematic cross-sectional view of an example of optically functional portions and concave portions in a light guide plate according to an embodiment of the present disclosure.

FIG. 12A is an enlarged cross-sectional view of a light emitting module 700 according to a fifth embodiment. FIG. 12B is an enlarged view of the light guide plate 7 in a region surrounded by a broken line shown in FIG. 12A. FIG. 12C respectively shows a top view, a longitudinal cross-sectional view, a bottom view, and a horizontal cross-sectional view of a light guide plate 7.

The light guide plate 7 in the light emitting module 700 according to the fifth embodiment includes one optically functional portion 7a for each light emitting element 11, and a plurality of light-reflective concave portions 7f disposed for each light emitting element 11. The light-reflective concave portions 7f are directed toward the corresponding light emitting element 11, and have light-reflective surfaces that reflect the light from the light emitting element 11. Here, in the example shown in the figure, the light guide plate 7 includes four, namely, the first to fourth light-reflective concave portions. The number of light-reflective concave portions is not limited thereto and can be plural, i.e., two or more. A sealing member 13b is disposed in each corresponding light-reflective concave portion 7f.

As shown in FIG. 12B, a first light-reflective concave portion 7f1 whose depth from a second main surface 7d is the largest is provided substantially at the center between the two adjacent concave portions 7b of the light guide plate 7. The first light-reflective concave portion 7f1 is provided in a quadrilateral, annular shape so as to surround the corresponding concave portion 7b in the top view. The second light-reflective concave portion 7f2 is disposed on the inner side of the first light-reflective concave portion 7f1. The third light-reflective concave portion 7f3 is disposed on the inner side of the second light-reflective concave portion 7f2. The fourth light-reflective concave portion 7f4 is disposed on the inner side of the third light-reflective concave portion 7f3 and at a position closest to the light emitting element 11. The first to fourth light-reflective concave portions include light-reflective surfaces 7f1a, 7f2a, 7f3a, and 7f4a that are respectively directed toward the light emitting element 11. By these light-reflective surfaces, the light from the light emitting element 11 can be reflected toward a first main surface 7c of the light guide plate 7. The first light-reflective concave portion 7f1 includes two light-reflective surfaces 7f1a so as to reflect the light from the two light emitting elements 11 that are disposed to sandwich the first light-reflective concave portion 7f1. The second to fourth light-reflective concave portions include light-reflection assisting surfaces 7f2b, 7f3b, and 7f4b that are arranged in descending order of the distance from the light emitting element 11, respectively. Each of these light reflection-assisting surfaces is a surface that can reflect light, which has been reflected by the opposed light-reflective surface.

The light-reflective concave portion 7f1 disposed at the farthest position from the light emitting element 11 has a larger depth than the second light-reflective concave portion 7f2 on the inner side thereof. Thus, part of the light emitted from the light emitting element 11 and which is not blocked by the light-reflective surfaces of the second to fourth light-reflective concave portions can be reflected. In this way, the light-reflective concave portion disposed closer to the light emitting element 11 is designed to have a smaller depth, which can effectively utilize the light-reflective surface of each light-reflective concave portion. A first light-reflective concave portion 7f1 is preferably deeper than the concave portion 7b. Consequently, the light emitted from the light emitting elements 11 can be reflected efficiently to make the surface luminance uniform.

An angle of the light-reflective surface of each light-reflective concave portion can be designed according to various factors, such as the purpose, application, and further light distribution properties of the light emitting element, and the thickness of the light guide plate. By way of example, a light guide plate made of polycarbonate and having a thickness of 1.1 mm is used. The concave portion 7b has a square shape of 0.5 mm×0.5 mm in the top view and has a depth of 0.1 mm. The distance between the adjacent concave portions 7b and 7b is 0.8 mm.

The first light-reflective concave portion 7f1 has a depth of 0.80 mm, and the light-reflective surface 7f1a is inclined at 16 degrees with respect to the second main surface 7d. The second light-reflective concave portion 7f2 has a depth of 0.50 mm, and the light-reflective surface 7f2a is inclined at 32 degrees with respect to the second main surface 7d. The third light-reflective concave portion 7f3 has a depth of 0.31 mm, and the light-reflective surface 7f3a is inclined at 45 degrees with respect to the second main surface 7d. The fourth light-reflective concave portion 7f4 has a depth of 0.15 mm, and the light-reflective surface 7f4a is inclined at 58 degrees with respect to the second main surface 7d.

5-1. Modified Example of Fifth Embodiment

A light guide plate 8 shown in FIG. 13 is a modified example of the light guide plate 7 shown in FIG. 12C. Here, a part including one optically functional portion 8a is illustrated. The optically functional portion 8a is substantially the same as the optically functional portion 7a in that it is a quadrangular pyramid concave shape having a quadrilateral opening. Further, these optically functional portions 7a and 8a are also the same in that the corner of the quadrilateral opening and the corner of a light source portion including the light emitting element are disposed at positions on the line that is shifted by 45 degrees with respect to the optical axis. The side surface of the optically functional portion 7a is an arc-shaped curved surface in the cross-sectional view, whereas the side surface of the optically functional portion 8a is not simply are in the cross-sectional view, but is a composite curved surface 8g that includes a combination of a plurality of arcs or elliptical arcs with different curvature radii.

For example, as shown in FIG. 8B, the curved surface 8g of the optically functional portion 8a includes a first curved surface 8ga disposed at a position close to an optical axis c and having a curvature radius R1, and a second curved surface 8gb disposed outside the first curved surface, i.e., at a position farther from the optical axis c than the first curved surface 8ga and having a curvature radius R2 that is larger than the curvature radius R1. In this way, the composite curved surface is formed by continuously arranging the arc-shaped curved surfaces so as to exhibit a larger curvature radius as the curved surface is farther from the optical axis c, so that the light from the light emitting elements can be more uniformly reflected in the planar shape. The number of curved surfaces is preferably 2 or more. For example, R1 can be 0.6 mm, and R2 can be 1.1 mm, or the like.

On a first main surface 8c, the maximum width of the opening of the optically functional portion 8a is substantially equal to the distance between the adjacent light emitting elements, and preferably approximately 40% to 80% of the distance between the light emitting elements.

Figure 13A:
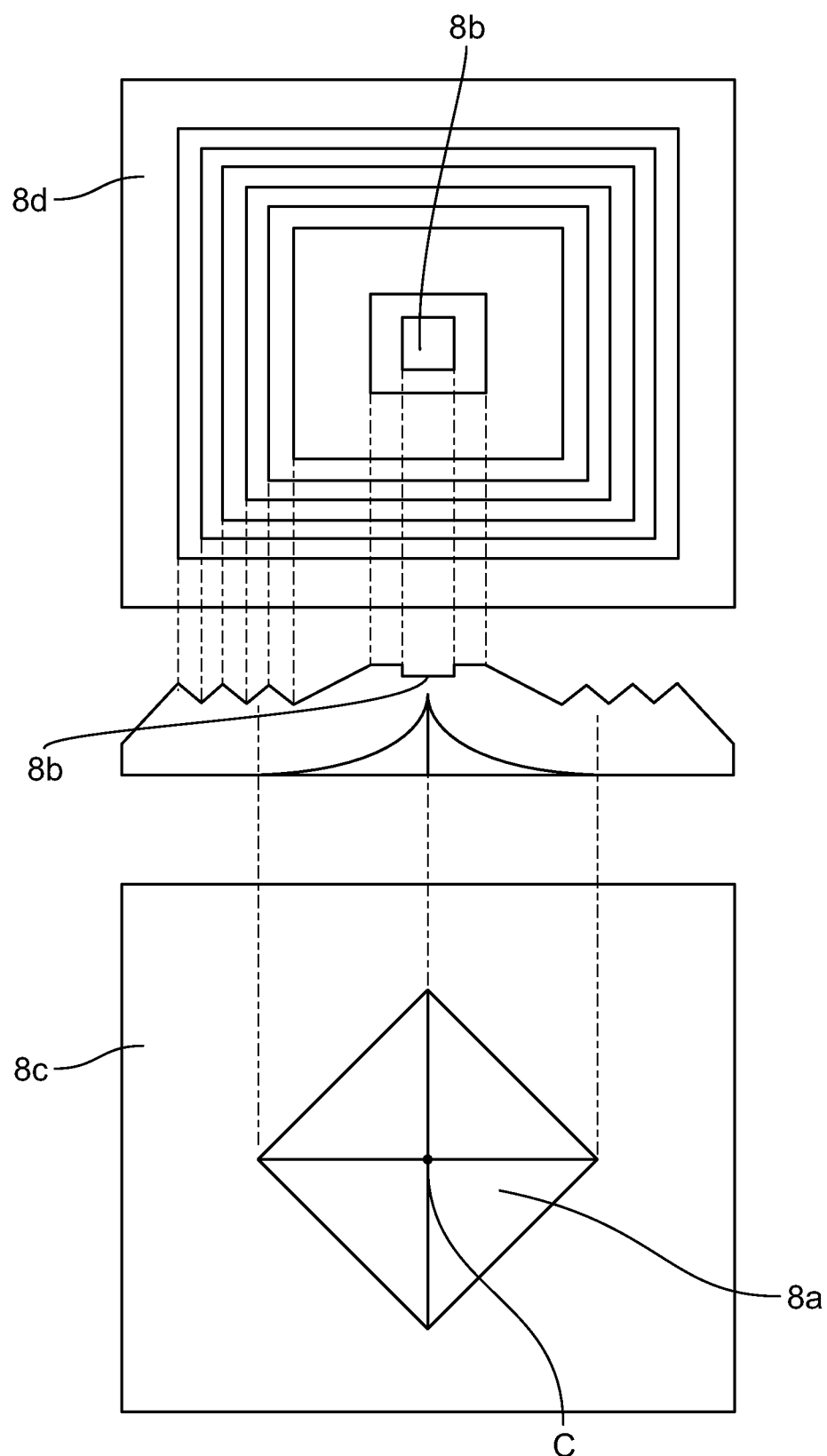
FIG. 13A shows a partially enlarged schematic planar view and a partially enlarged schematic cross-sectional view of an example of optically functional portions and concave portions in a light guide plate according to an embodiment of the present disclosure.
Figure 13B:
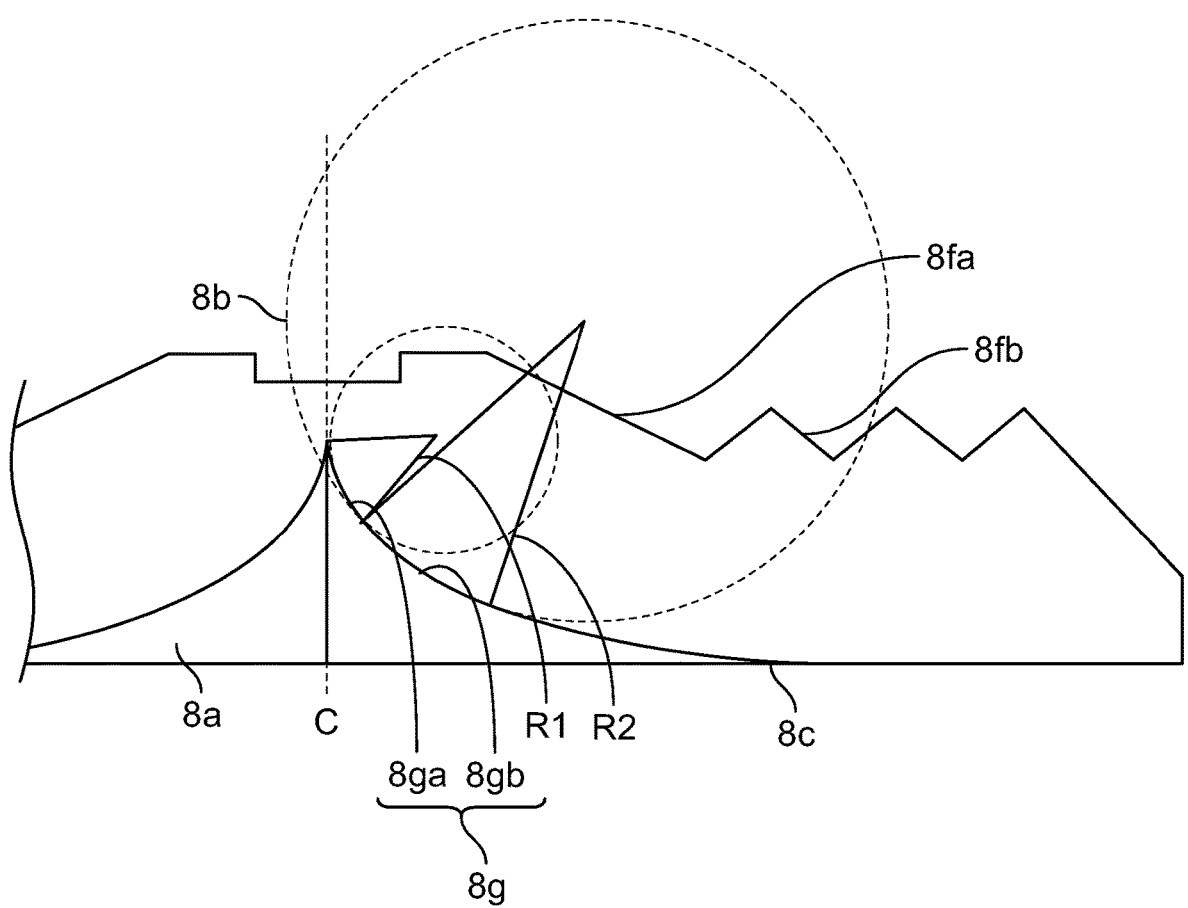
FIG. 13B is a partially enlarged cross-sectional view of an optically functional portion in a light guide plate according to an embodiment of the present disclosure.

As shown in FIGS. 13A and 13B, the light-reflective surfaces 8fa and 8fb located on the side of a second main surface 8b are disposed such that the deepest part of the light-reflective surface 8fa, which is the closest to the light source c, is positioned closer to the first main surface 8c than the deepest part (part located on the optical axis) of the optically functional portion 8a from the first main surface 8c. Thus, the light from the light emitting element is easily reflected by the light-reflective surface 8fa. Although FIG. 12B shows an example in which the height of the light-reflective surface (depth of the light-reflective concave portion) gradually changes, as shown in FIG. 13B, the reflective surface 8fa closest to the optical axis may be located at the same height (depth of the light-reflective concave portion) as the light-reflective surface 8fb disposed outside the light-reflective surface 8fa.

The light emitting module according to the present disclosure can be used, for example, as a backlight of a liquid crystal display device.

What is claimed is:

1. A method of manufacturing a light emitting module comprising:
    preparing a light guide plate that comprises a first main surface serving as a light-emitting surface and a second main surface opposite to the first main surface;
    providing a plurality of optically functional portions at the first surface of the light guide plate;
    forming a plurality of concave portions on a side of the second main surface so as to overlap with each of the optically functional portions in a planar perspective projection;
    disposing a wavelength conversion material in the concave portions to form a plurality of wavelength conversion portions;
    disposing a light-transmissive joining member on each of the wavelength conversion material of the plurality of wavelength conversion portions;
    providing each of a plurality of light emitting elements on each of the wavelength conversion material of the plurality of wavelength conversion portions, wherein the plurality of light emitting elements are joined to the wavelength conversion material by the light-transmissive joining member, and wherein the light-transmissive joining member is provided to cover side surfaces of the light emitting element and is formed in a shape that expands toward the light guide plate in a cross-sectional view; and
    forming wires electrically connecting the plurality of light emitting elements.

2. The method of manufacturing a light emitting module according to claim 1, wherein preparing a light guide plate comprises forming concave portions to form the optically functional portions.

3. The method of manufacturing a light emitting module according to claim 1, wherein a size in the top view of each of the optically functional portions is larger than a size in the top view of each of the light emitting elements.

4. The method of manufacturing a light emitting module according to claim 1, wherein each of the optically functional portions comprises a central concave portion and annular convex portion surrounding the convex portion.

5. The method of manufacturing a light emitting module according to claim 2, wherein the concave portions are formed so that side surfaces of the concave portions have spiral groove portions.

6. The method of manufacturing a light emitting module according to claim 1, further comprising forming light-scattering portions, each being disposed between adjacent optically functional portions.

7. The method of manufacturing a light emitting module according to claim 1, further comprising forming light-reflective concave portions disposed between adjacent light emitting elements on a side of the second main surface.

8. The method of manufacturing a light emitting module according to claim 7, wherein two or more light-reflective concave portions are disposed between the adjacent light emitting elements.

9. The method of manufacturing a light emitting module according to claim 1, further comprising forming light-reflective sealing member to cover side surfaces of the light emitting element and the second main surface of the light guide plate.

10. The method of manufacturing a light emitting module according to claim 9, wherein the light-reflective sealing member is formed to be in contact with the light-transmissive joining member.

11. The method of manufacturing a light emitting module according to claim 9, wherein the light-reflective sealing member is formed in light-reflective concave portions in the second main surface of the light guide plate.

12. The method of manufacturing a light emitting module according to claim 1, wherein the light emitting element includes a sapphire substrate, and wherein the light-transmissive joining member is provided to cover at least a part of the side surface of the sapphire substrate.

* * * * *